United States Patent [19]
Watanabe et al.

[11] Patent Number: 5,895,938
[45] Date of Patent: Apr. 20, 1999

[54] SEMICONDUCTOR DEVICE USING SEMICONDUCTOR BCN COMPOUNDS

[75] Inventors: Miyoko Watanabe, Toride; Koichi Mizushima, Kamakura; Satoshi Itoh, Ibaraki-ken; Masao Mashita, Yokohama, all of Japan

[73] Assignee: Kabushiki Kaisha Toshiba, Kawasaki, Japan

[21] Appl. No.: 08/798,102

[22] Filed: Feb. 12, 1997

[30] Foreign Application Priority Data

Feb. 16, 1996 [JP] Japan ................................. 8-029353
Feb. 3, 1997 [JP] Japan ................................. 9-020470

[51] Int. Cl.$^6$ ............................................. H01L 31/0312
[52] U.S. Cl. ............................ 257/77; 257/85; 257/103
[58] Field of Search ................................. 257/73, 103

[56] References Cited

U.S. PATENT DOCUMENTS 5,747,118   5/1998   Bunshah et al. ........................ 427/577

OTHER PUBLICATIONS

M. O. Watanabe, et al., "Electrical properties of $BC_2N$ thin films prepared by chemical vapor deposition", J. Appl. Phys. 78 (4), Aug. 15, 1995, pp. 2880–2882.

Primary Examiner—Olik Chaudhuri
Assistant Examiner—Douglas A. Wille
Attorney, Agent, or Firm—Oblon, Spivak, McClelland, Maier & Neustadt, P.C.

[57] ABSTRACT

Disclosed is a semiconductor device comprising a semiconductor BCN compound layer and a metallic BCN compound layer and/or an insulating BCN compound layer, wherein the semiconductor BCN compound layer and the metallic BCN compound layer and/or insulating BCN compound layer are stacked one upon the other.

16 Claims, 14 Drawing Sheets

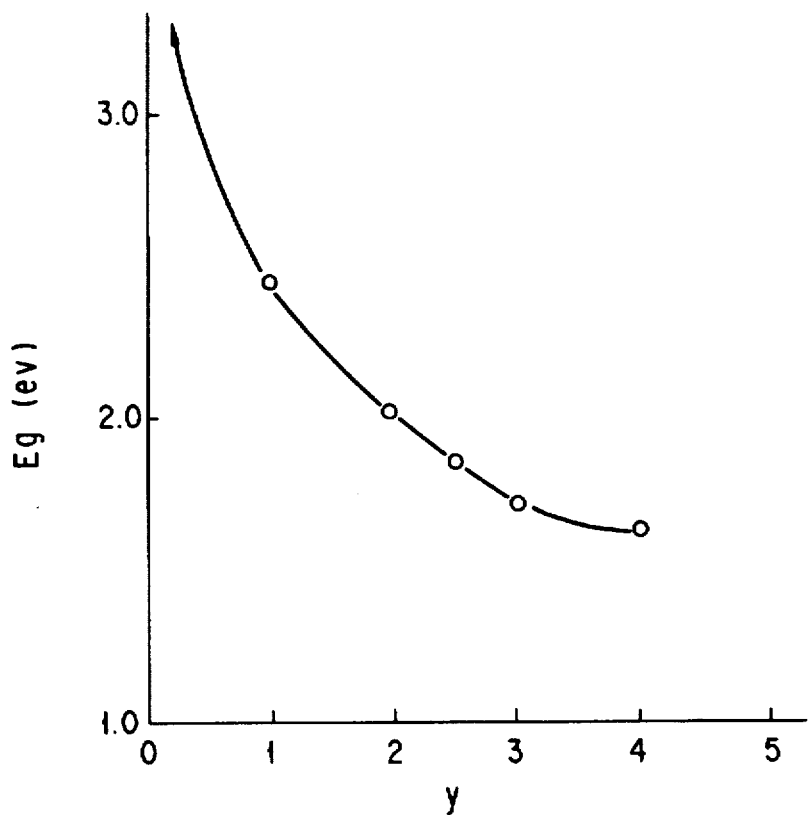
F I G. 1
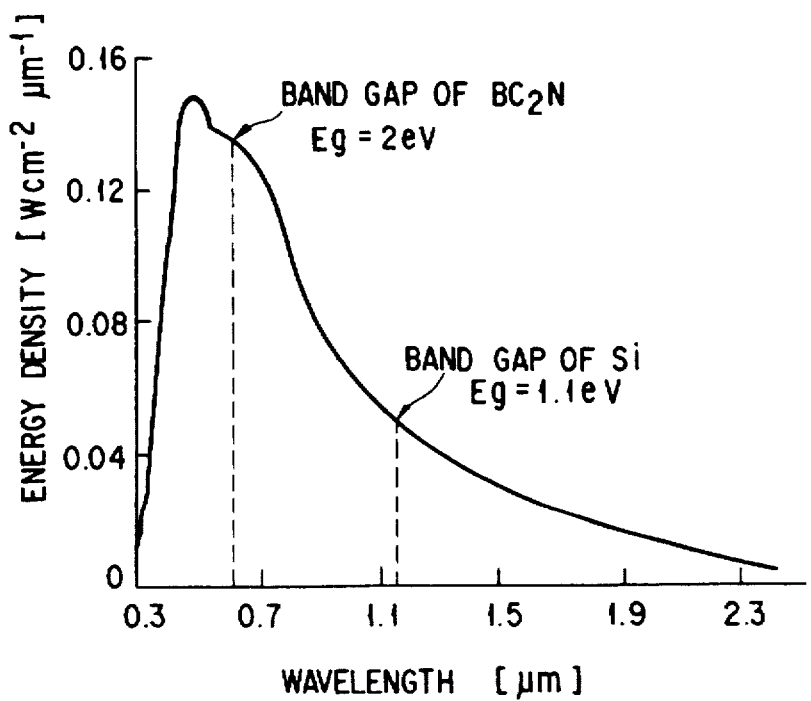
F I G. 2

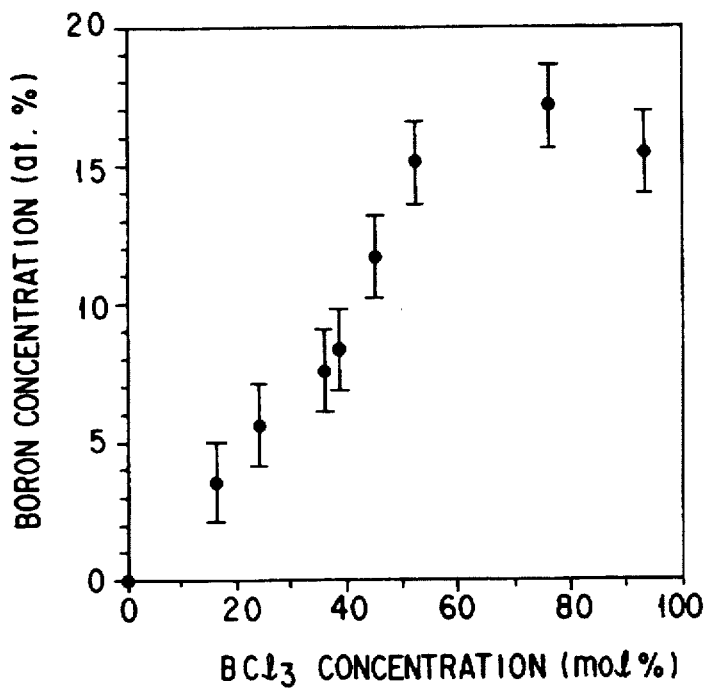
F I G. 3
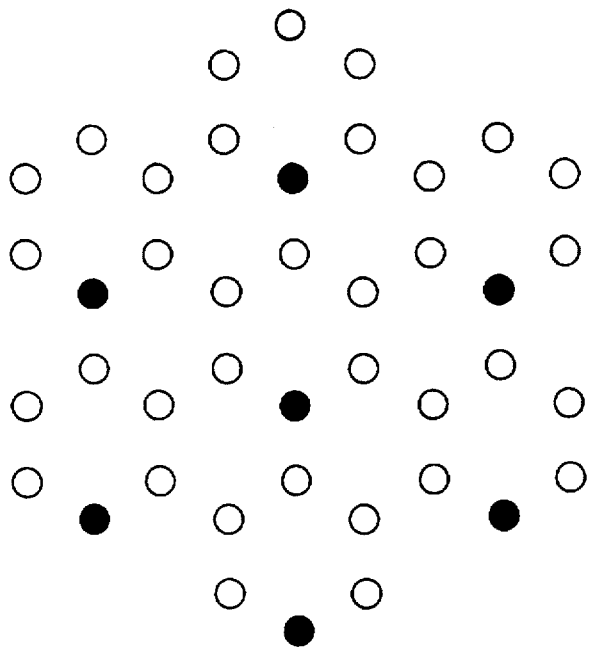
F I G. 4

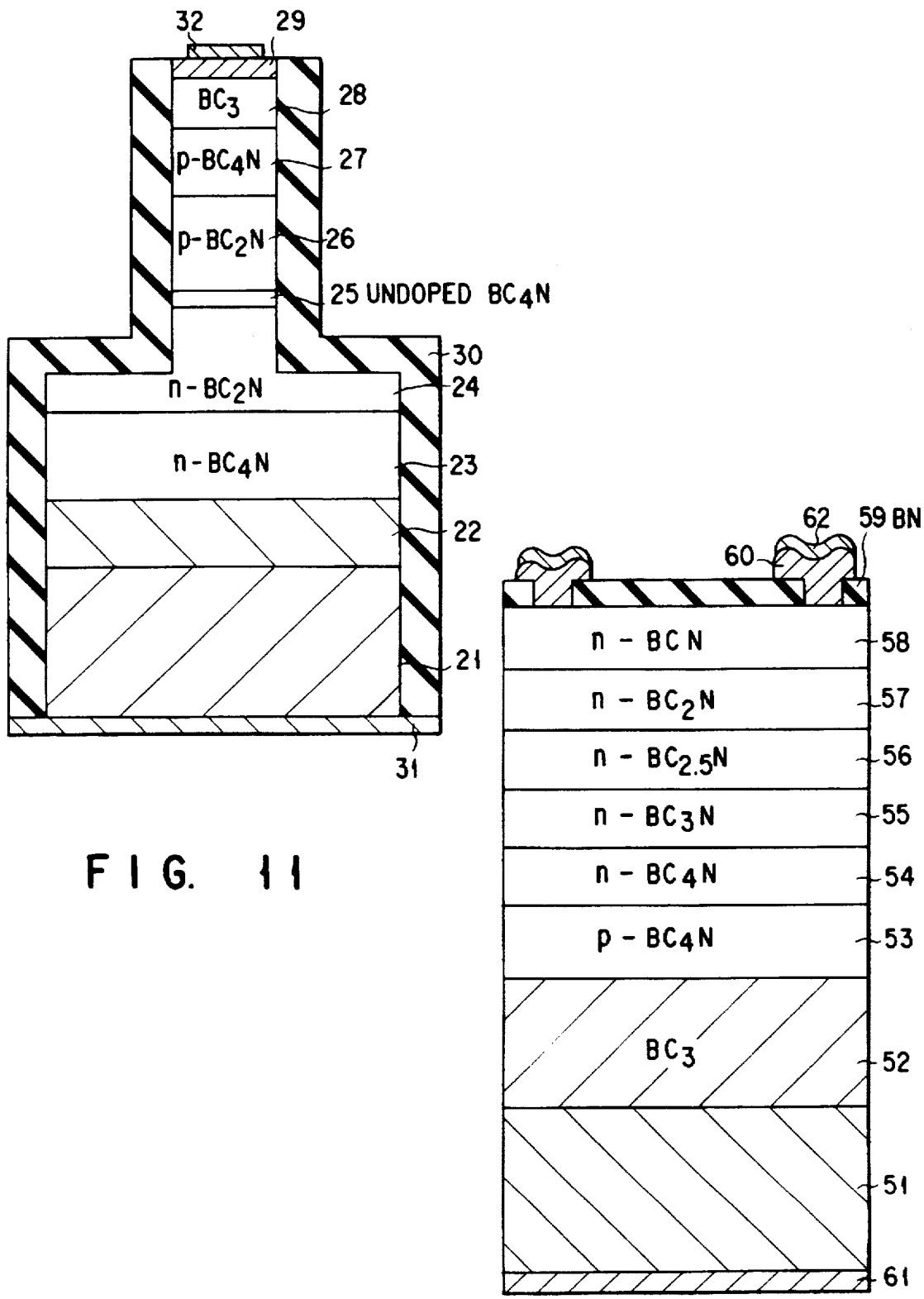

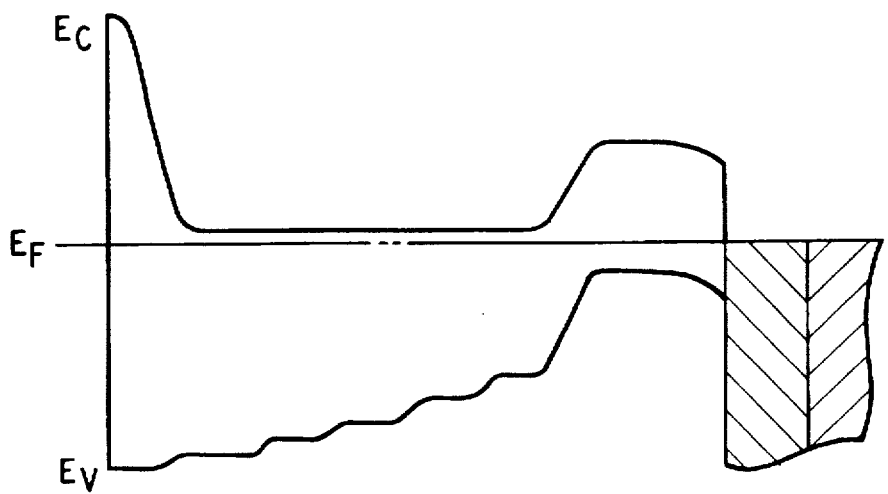
F I G. 17
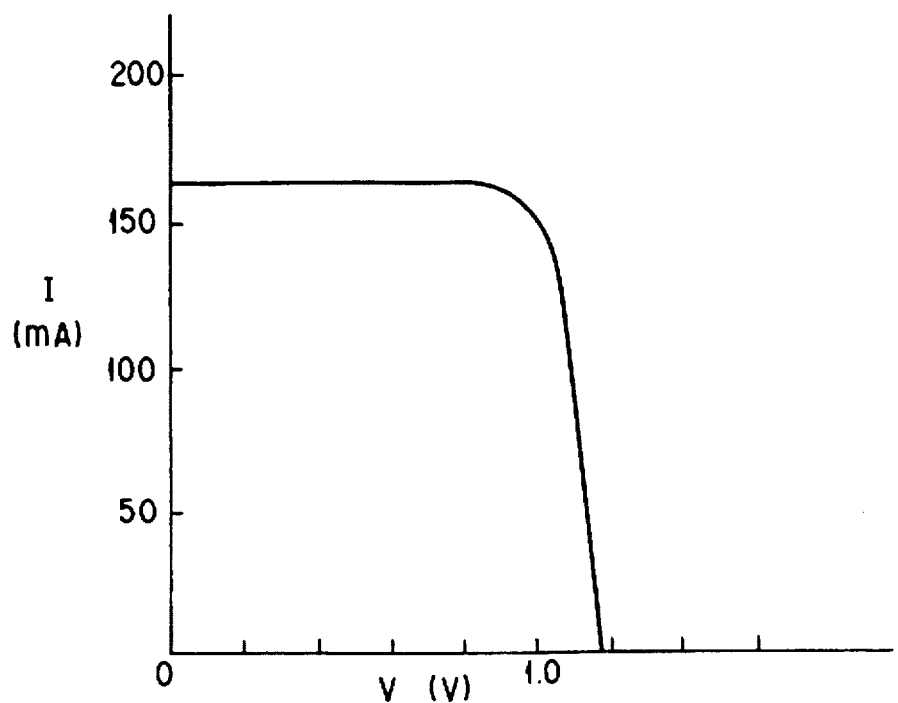
F I G. 18

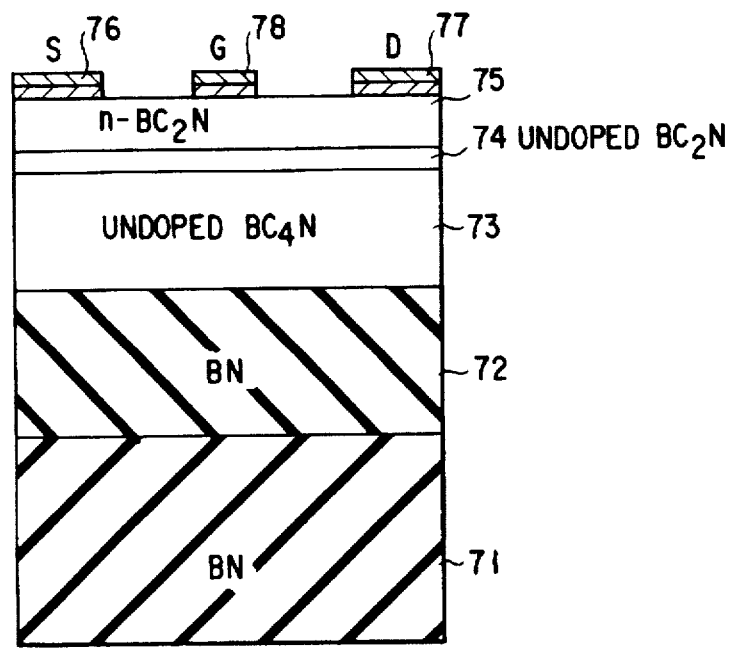
F I G. 19
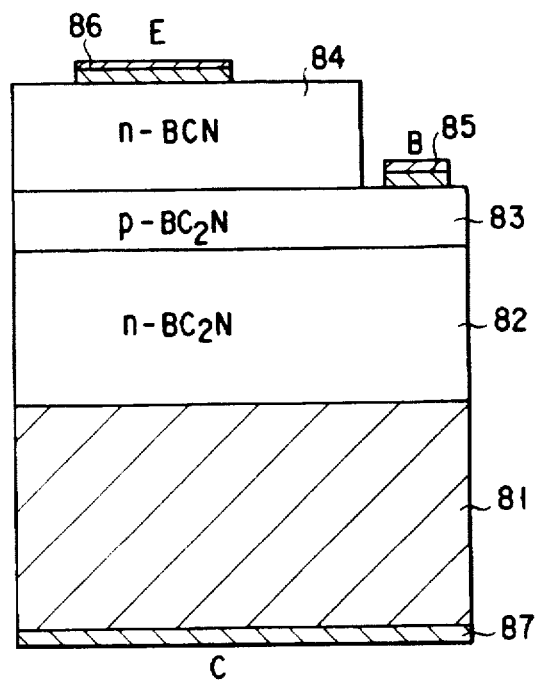
F I G. 20

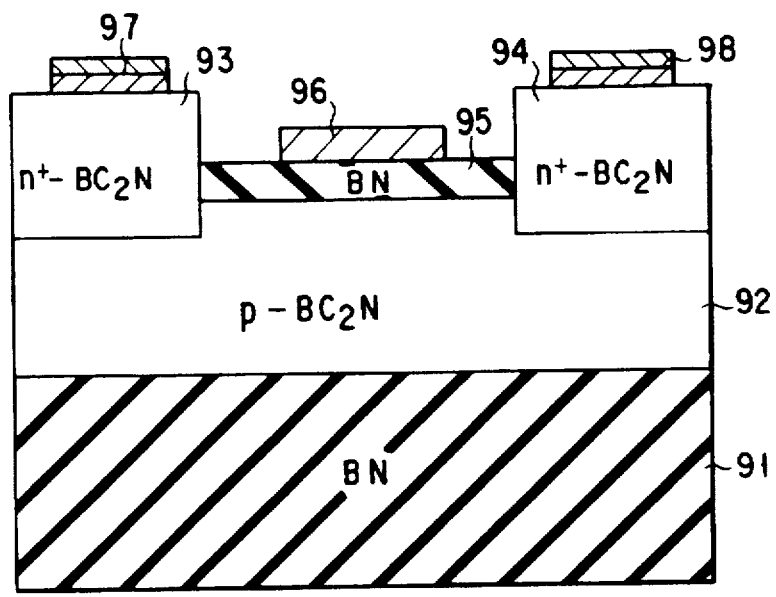
F I G. 21
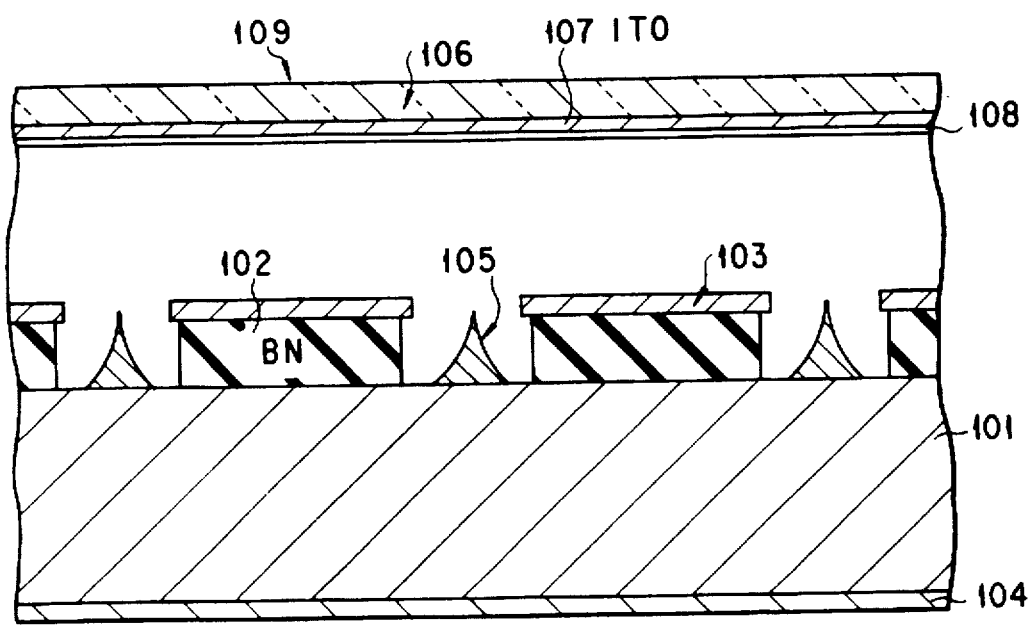
F I G. 22

SEMICONDUCTOR DEVICE USING SEMICONDUCTOR BCN COMPOUNDS

BACKGROUND OF THE INVENTION

1. Field of the Invention

The present invention relates to semiconductor devices using semiconductor BCN compounds such as a light-emitting device and a solar cell.

2. Discussion of the Background

In recent years, various devices using semiconductor materials are used in the field of electronics.

For example, a semiconductor light-emitting diode is generally used as a light-emitting device for a display purpose. Likewise, a semiconductor laser is generally used for an optical communication and for information processing. The light-emitting diode and semiconductor laser, which are close to each other in the principle of light emission, are constructed to comprise a pn junction. To be more specific, electrons and holes are injected into the semiconductor layers forming the pn junction by applying a forward bias voltage across the element, with the result that these electrons and holes are recombined in the vicinity of the pn junction so as to emit light. When it comes to the light-emitting diode, spontaneous emission is radiated as a result of the recombination. On the other hand, when it comes to the semiconductor laser, the emission as a result of recombination is allowed to resonate between resonating planes so as to bring about an induced emission, thereby obtaining an oscillated light having uniform phase. The semiconductor laser is featured in that it can be miniaturized, can be operated with a high efficiency, and permits a rapid modulation.

However, the wavelength of the light emitted from the light-emitting diode or the semiconductor laser is limited by the band gap of the light-emitting layer, resulting in a failure to cover the entire wavelength region of the visible light. Semiconductor materials used in the semiconductor laser include, for example, InGaAsP, which is used in an infrared laser, and InGaAlP, which is used in a red laser. When it comes to a blue laser, GaN, ZnSe and ZnS are under study. However, these semiconductor materials leave room for further improvement in the crystal quality and lack in reliability. Further, the conventional semiconductor materials contain harmful elements such as As and Se and costly elements such as Ga and, thus, are not satisfactory in terms of environmental problems and manufacturing costs of the semiconductor laser. Such being the situation, vigorous studies are being made in an attempt to develop novel semiconductor materials which emit light of wavelengths covering a wide range.

What should also be noted is that a high importance is placed in recent years on the necessity of substitute energies for petroleum. Further, the environmental problems are turned serious. Under the circumstances, a solar cell utilizing sunlight, which is a safe and unlimited clean energy, has come to be used. Solar cells using semiconductor materials such as a single crystal, polycrystalline or amorphous Si or GaAs have come to be put into practical use to date. The solar cell includes as a basic construction a semiconductor pn junction or a semiconductor-metal Schottky junction. If the semiconductor layer acting as a light absorption layer is irradiated with sunlight, numerous electrons and holes are generated and accelerated in the vicinity of the junction so as to cause a flow of current. When it comes to an element of a pn junction type, the electrons and holes flow into the n-type and p-type semiconductor layers, respectively. Also, a voltage is generated through an external load resistor.

The solar cell is required to satisfy various characteristics. Particularly, it is important to improve conversion efficiency, i.e., a ratio of the output at an optimum operating point to the input sunlight. In many cases, an improvement of the conversion efficiency permits also improving other characteristics. In the case of a silicon solar cell, which is most widely used nowadays, a conversion efficiency of 24% has already been obtained in a laboratory level. However, the value in the practical level is not so high. Specifically, the conversion efficiency in the practical level is only about 20% even in a solar cell using a semiconductor material of GaAs/AlGaAs which is said to exhibit a high conversion efficiency.

Where a junction is formed between two layers, strain or stress is generated at the interface between the two layers because of a difference in lattice constant between the two layers. The particular strain or stress is one of the reasons for a failure to improve the conversion efficiency of the solar cell. Specifically, the strain or stress forms a deep energy level within the semiconductor layer so as to provide a recombination center between the electron and hole, leading to a low conversion efficiency. Naturally, it is very important to develop semiconductor materials and combinations of semiconductor materials and metal materials capable of forming a good junction interface.

Further, in many various semiconductor devices other than the light-emitting device and solar cell, a marked improvement in device characteristics can be expected by using semiconductor materials and combinations of semiconductor materials and metal materials having a suitable band gap and capable of forming a good junction interface.

Under the circumstances, the present inventors have paid attention to BCN compounds as novel semiconductor materials. It is possible for the BCN compound, which is represented by a general formula $B_xC_yN_z$ (x, y, z≧0), to have two kinds of crystal structures, i.e., a cubic system and hexagonal system. In general, the crystal growth of the BCN compound is achieved by a CVD (chemical vapor deposition) method. Under the general conditions differing from the atmosphere of high temperatures and high pressures, the BCN compound grows into a crystal of hexagonal system having a layered structure. The properties of the BCN compounds having a layered structure depend on the combination of the component elements, ratio of the component elements, and arrangement of the atoms of the component elements. Depending on these factors, the BCN compounds exhibit various properties similar to those of metals, semiconductor materials having various band gaps, and insulators. For example, it is well known in the art that graphite consisting of carbon atoms alone exhibits properties of a semi-metal. Boron nitride (BN) is known well to be an insulator having a band gap of about 6 eV. Further, it has been confirmed by recent research that $BC_3$ and $C_5N$ are metals. Still further, it is reported by the present inventors that $BC_2N$ is a semiconductor (J. Appl. Phys., Vol. 78, No. 4, pp. 2880–2882, Aug. 15, 1995). What should also be noted is that these BCN compounds have the same crystal structure and are close to each other in the lattice constant.

A semiconductor device having a BCN compound actually used therein is unknown to the art. However, it is considered possible in use effectively the BCN compounds in various semiconductor devices by utilizing the various properties of the BCN compounds pointed out above. In order to use the BCN compounds in the manufacture of a semiconductor device exhibiting desired characteristics, it is necessary to control as desired the compositions of the BCN semiconductor layers, to control the doping of p- and n-type impurities in the BCN semiconductor layers, and to suppress the defects in the BCN semiconductor crystals and junction interfaces.

BRIEF SUMMARY OF THE INVENTION

An object of the present invention is to provide a semiconductor device using a semiconductor BCN compound such as a light-emitting device or a solar cell having excellent characteristics.

According to the present invention, there is provided a semiconductor device, comprising a semiconductor BCN compound layer, and a metallic BCN compound layer and/or an insulating BCN compound layer, said layers being stacked one upon the other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention, in which:

FIG. 1 is a graph showing the relationship between the carbon content y and the band gap in respect of the $BC_yN$ compounds;

FIG. 2 is a graph showing the band gaps of $BC_2N$ and Si relative to the sunlight spectrum;

FIG. 3 is a graph showing the relationship between the $BCl_3$ concentration in the source gases and the boron concentration in the thin film formed;

FIG. 4 shows the atomic arrangement of boron and carbon in the $BC_5$ compound;

FIG. 11 is a cross sectional view showing the construction of a semiconductor laser in Example 3;

FIG. 16 is a cross sectional view of a solar cell in Example 5;

FIG. 17 shows the band diagram of the solar cell shown in FIG. 16;

FIG. 18 shows the I-V characteristics of the solar cell shown in FIG. 16;

FIG. 19 is a cross sectional view showing the construction of a heterojunction field effect transistor in Example 6;

FIG. 20 is a cross sectional view showing the construction of a heterojunction bipolar transistor in Example 7;

FIG. 21 is a cross sectional view showing the construction of a MIS field effect transistor in Example 8;

FIG. 22 is a cross sectional view showing the construction of a field emitter array in Example 9;

DETAILED DESCRIPTION OF THE INVENTION

Figure 5:
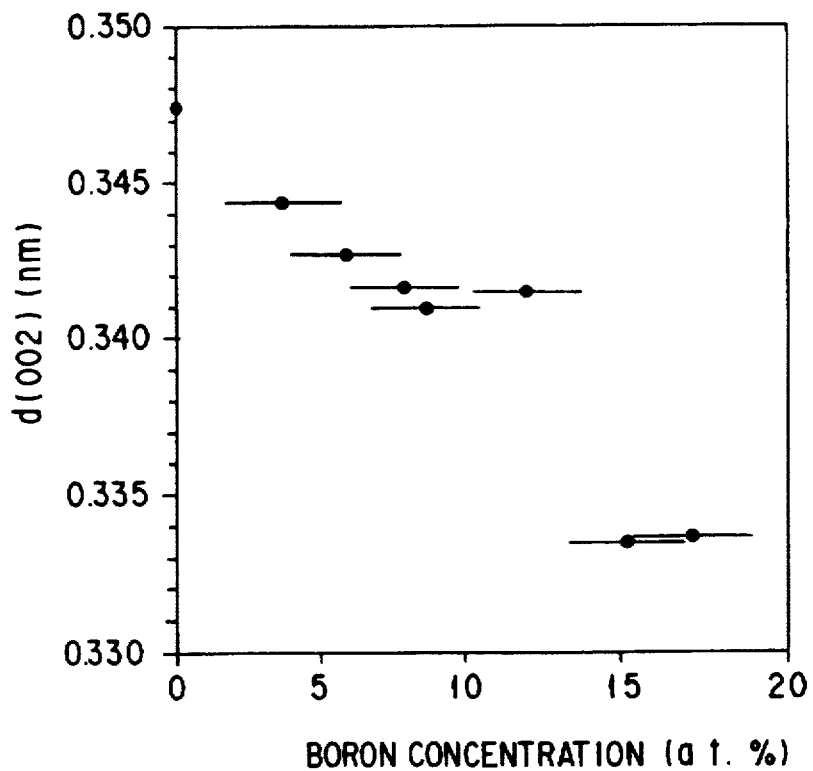
FIG. 5 is a graph showing the relationship between the boron concentration in a $B_xC_y$ thin film and a lattice spacing distance.

The present invention provides a semiconductor device, comprising a semiconductor BCN compound layer and a metallic BCN compound layer and/or an insulating BCN compound layer stacked on the semiconductor BCN compound layer. The semiconductor device of the present invention may comprise two semiconductor BCN compound layers differing from each other in composition so as to form a heterojunction.

The semiconductor BCN compound used in the present invention is selected from the group consisting of $BC_yN$ ($\frac{1}{4}<y\leq 4$), $BC_y$ ($0\leq y\leq \frac{1}{4}$), and $CN_z$ ($\frac{1}{5}\leq z\leq 1$). The metallic BCN compound used in the present invention is selected from the group consisting of $BC_3$ and $CN_z$ ($0\leq z\leq \frac{1}{5}$). Further, the insulating BCN compound used in the present invention is represented by $BC_yN$ ($0\leq y\leq \frac{1}{5}$).

The semiconductor BCN compound, metallic BCN compound and insulating BCN compound used in the present invention are close to each other in the lattice constant, making it possible to obtain a good junction.

The semiconductor $B_xC_yN_z$ compounds used in the present invention have a different band gap depending on the composition of the compound. For example, FIG. 1 shows the relationship between the value of y and the band gap of the $BC_yN$ compounds, in which each of x and z is set at 1. As seen from FIG. 1, the compound $BC_2N$, i.e., where the value of y is 2, is a semiconductor having a band gap of about 2 eV. It is also seen that the band gap of the BCN compound is increased with a decrease of y, i.e., with a decrease of the carbon content. On the other hand, the band gap of the BCN compound is decreased with an increase of y, i.e., with an increase of the carbon content. It follows that a semiconductor BCN compound having a desired band gap can be obtained by changing appropriately the composition of the compound in view of the desired device characteristics.

When it comes to, for example, a semiconductor light-emitting diode, a material having a band gap corresponding to a desired wavelength of the emitted light is used as a semiconductor BCN compound forming a light-emitting layer (active layer). Therefore, the present invention permits manufacturing any type of light-emitting diodes emitting a visible light, infrared light, far infrared light and ultraviolet light. The light-emitting layer included in the light-emitting diode of the present invention may be of a single layer of a semiconductor BCN compound or may be a p-type semiconductor BCN compound layer and an n-type semiconductor BCN compound layer arranged to form a pn junction.

The semiconductor light-emitting diode of the present invention comprises p- and n-type semiconductor layers acting as carrier injection layers and formed outside the light-emitting layer. Each of these carrier injection layers should be formed of a semiconductor material having a band gap greater than that of the BCN compound forming the light-emitting layer so as to permit the carriers to be confined to the light-emitting layer and, thus, to improve the light-emitting efficiency. For forming a good junction interface between the carrier injection layer and the light-emitting layer, a semiconductor BCN compound can be used for forming the carrier injection layer.

When it comes to a semiconductor laser, a material having a band gap corresponding to a desired wavelength of the emitted light is used as a semiconductor BCN compound forming a light-emitting layer (active layer). The semiconductor laser of the present invention comprises p- and n-type semiconductor layers acting as cladding layers. Each of these cladding layers should be formed of a semiconductor material having a band gap greater than that of the BCN compound forming the light-emitting layer so as to permit the carriers to be confined to the light-emitting layer. The side surfaces of the light-emitting layer and cladding layers, i.e., planes perpendicular to the junction of these layers, act as resonating planes so as to obtain a semiconductor laser which permits emitting a laser light having a desired oscillation wavelength. In this case, a good junction interface can be formed by using p- and n-type semiconductor BCN compounds for forming the cladding layers. Further, the efficiency can be improved by coating the resonating planes noted above with an insulating boron nitride (BN).

FIG. 2 is a graph showing the band gaps of $BC_2N$ and Si relative to the sunlight spectrum. As seen from FIG. 2, the energy density of the sunlight at the wavelength corresponding to the band gap of Si is very low; whereas, the spectrum of the sunlight forms a maximum in the vicinity of the wavelength corresponding to the band gap of $BC_2N$. It follows that the conversion efficiency of the solar cell can be improved by using a semiconductor BCN compound for forming a light absorbing layer of the solar cell.

When it comes to a Schottky junction type solar cell, it is desirable to use a semiconductor BCN compound having a band gap most effective for absorbing the sunlight, e.g., $BC_2N$, for forming a light absorbing layer. In the case of using $BC_2N$, the conversion efficiency of the solar cell can be markedly improved. The solar cell also comprises electrodes formed in Schottky junction with the outer surfaces of the light-absorbing layer so as to bring the carriers generated within the light-absorbing layer upon light irradiation to the outside. For forming the electrode, it is desirable to use a BCN compound having a lattice constant close to that of the semiconductor BCN compound forming the light-absorbing layer. For example, it is desirable to use graphite, $BC_3$ or $C_5N$ for forming the electrode. Incidentally, an ordinary metal such as Ni can also be used for forming the electrode, as long as the metal has a lattice constant close to that of the semiconductor BCN compound. To reiterate, the Schottky electrode material used in the present invention has a lattice constant close to that of the semiconductor layer on which the electrode is formed unlike the conventional combination of the semiconductor material and the metal material used for forming a Schottky junction. It follows that it is possible to suppress generation of strains and defects at the interface of the Schottky junction, making it possible to suppress reduction of the conversion efficiency in the present invention.

In the case of a pn junction type solar cell, it is desirable in terms of improvement of the conversion efficiency to use a semiconductor BCN compound having a band gap most effective for absorbing the sunlight for forming p- and/or n-type semiconductor layers acting as light-absorbing layers. Also, it is possible to employ a laminate structure consisting of a plurality of semiconductor BCN compound layers in the pn junction type solar cell. In this case, the laminate structure is formed in contact with the upper surface of the light-absorbing layer of the solar cell such that the band gaps of the BCN compound layers are progressively increased toward the uppermost layer of the laminate structure. In the solar cell of the particular construction, the sunlight component having a high energy is absorbed by the upper semiconductor BCN compound layer having a large band gap. On the other hand, the sunlight component having a low energy runs to reach the inner region of the solar cell so as to be absorbed by the semiconductor BCN compound layer having a small band gap and positioned in the inner region of the solar cell. It follows that the solar cell of the particular construction permits absorbing the sunlight of a very wide wavelength range, leading to a marked improvement of the conversion efficiency. It should be noted that the semiconductor BCN compounds forming the light-absorbing layers having a pn junction different in composition from the semiconductor BCN compound layers laminated on the light-absorbing layer. It follows that a heterojunction is formed in the surface side of the pn junction. However, occurrence of strains and defects is suppressed in the vicinity of the heterojunction interface because the semiconductor BCN compounds have a layered crystal structure and are close to each other in the lattice constant. It follows that reduction in the conversion efficiency can be suppressed in the pn junction type solar cell of the present invention.

The solar cell further comprises an antireflection layer constituting the uppermost layer. It is desirable to use a layer of boron nitride (BN), which is a BCN compound, as the antireflection layer. It should be noted that the BN antireflection layer is close in its lattice constant to the semiconductor BCN compound layer in contact with the BN layer so as to suppress the defect occurrence at the interface between these two layers and, thus, to stabilize the surface of the BCN compound layer in contact with the antireflection layer. In addition, a semiconductor BCN compound, e.g., $BC_2N$, exhibits a thermal expansion coefficient of $1 \times 10^{-6}$, which is very close to that of h-BN, i.e., $7.7 \times 10^{-7}$. It follows that a strain derived from the temperature change is unlikely to be generated in the case of using a BN antireflection layer.

As apparent from the description given above, BCN compounds can be used in various semiconductor devices so as to obtain prominent effects. When it comes to, for example, a heterojunction field effect transistor or a heterojunction bipolar transistor, it is desirable to use semiconductor BCN compounds having different compositions for forming semiconductor layers positioned to form a heterojunction. In this case, it is possible to suppress occurrence of strains or defects because the semiconductor layers forming a heterojunction are close to each other in the lattice constant, making it possible to obtain a satisfactory heterojunction low in its interfacial level. Also, in the case of using a BCN compound, a satisfactory interface can be formed between a semiconductor layer and a metal layer and between a semiconductor layer and an insulating layer, leading to improvements in the characteristics of various semiconductor devices. Such being the situation, a conductive BCN compound or an insulating BCN compound can be used for forming, for example, source and drain electrodes and a Schottky gate electrode in a heterojunction field effect transistor, a gate insulating film and gate electrode of a MIS field effect transistor, a collector electrode, gate electrode, gate insulating film and emitter electrode of a field emission device, and an emitter electrode, gate insulating film and gate electrode of a power element.

Let us describe how to manufacture a semiconductor device of the present invention using a BCN compound. Specifically, the method of the present invention for manufacturing a semiconductor device comprises the step of introducing raw material gases containing B, C and N into a reaction chamber for decomposition of these gases to form a BCN compound on a substrate. The particular step is repeated with a different ratio of the raw material gases so as to form a semiconductor device comprising a semiconductor BCN compound layer, and a metallic BCN compound layer and/or an insulating BCN compound layer, said layers being stacked one upon the other.

In the method of forming a BCN compound layer by a CVD method, $BCl_3$, $CH_4$ and $NH_3$ are generally used as source gases of B, C and N, respectively. Alternatively, $BCl_3$ as a source gas of B and $CH_3CN$ as a source gas of C and N may be used. In these methods, the substrate temperature is set at 850° C. or more in the step of forming the BCN compound layer by decomposing the source gases. If the substrate temperature is lower than the value given above, a source gas having a high decomposition temperature fails to contribute to formation of the BCN compound layer on the substrate. It follows that the resultant BCN compound layer fails to have a desired composition. In addition, the crystallinity of the resultant BCN compound layer is markedly impaired.

It should be noted, however, that if the substrate temperature is set at such a high value as 850° C. or more as in the above method, the graphite phase is separated from the BN phase within the resultant BCN compound layer. In other words, the BCN compound layer fails to have a uniform composition. What should also be noted is that sulfur (S), which is used as an n-type dopant, has a high vapor pressure. It follows that, if the substrate temperature is unduly high as in the above method, sulfur is evaporated through the surface of the BCN compound layer and, thus, fails to be doped in the BCN compound layer. On the other hand, zinc (Zn) used as a p-type dopant is excessively diffused within the BCN compound layer, if the substrate temperature is unduly high, resulting in a failure to obtain a desired doping profile.

Under the circumstances, it is desirable to set the substrate temperature in the step of forming a BCN compound layer by CVD at 600 to 800° C. regardless of the decomposition temperatures of the source gases in order to achieve a good crystallinity of the resultant BCN compound layer and to control as desired the composition and impurity doping in the BCN compound layer. If the substrate temperature exceeds 800° C., it is difficult to control as desired the composition and impurity doping in the resultant BCN compound layer. On the other hand, if the substrate temperature is lower than 600° C., the crystallinity of the resultant BCN compound layer is impaired.

In order to meet the condition described above, used in the present invention as a source gas of carbon is a compound represented by a general formula "$MR_mH_n$", where M is a metal element, R is an organic group, n is 0 or an integer of 1 or more, and m is an integer of 1 or more. The specific compounds used in the present invention include, for example, $Al(CH_3)_3$ and $Ga(CH_3)_3$. It should be noted that $CH_3$ radicals are generated from these source gases even if decomposed at such a low temperature as 600 to 800° C. Further, these radicals permit carbon deposition on the substrate surface, as given below:

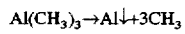

$Al(CH_3)_3 \rightarrow Al\downarrow + 3CH_3$

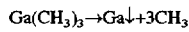

$Ga(CH_3)_3 \rightarrow Ga\downarrow + 3CH_3$

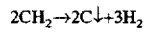

$2CH_2 \rightarrow 2C\downarrow + 3H_2$

On the other hand, an ammonia gas ($NH_3$) is used as a source gas of nitrogen. It should be noted that the ammonia gas, when used singly, is not decomposed unless the gas is heated to such a high temperature as 1,000° C. In the present invention, however, the ammonia gas collides against the $CH_3$ radicals, which are generated from the C-containing source gas, in the gas phase or on the substrate surface so as to generate active $NH_2$ radicals, as given below:

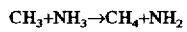

$CH_3 + NH_3 \rightarrow CH_4 + NH_2$

Further, the $NH_2$ radicals permit nitrogen deposition on the substrate surface.

The source gas of boron, which is used in the present invention, includes $B(CH_3)_3$ and $B(C_2H_5)_3$. These source gases are decomposed sufficiently at such a low temperature as 600 to 800° C. Incidentally, it is certainly possible to use $BCl_3$ as the B-containing source gas. However, the use of a $BCl_3$ gas should desirably be avoided because Cl or HCl, which is generated during the decomposition process of the gas, tends to corrode the reaction equipment.

It should be noted that, if the C-containing source gas is decomposed on a substrate surface, Al or Ga is mixed into the resultant BCN compound layer. To overcome this difficulty, a preliminary heating is applied to the C-containing source gas in the present invention so as to decompose completely the source gas before the gas flows to reach the substrate surface. Because of the decomposition, the metal component of Al or Ga is trapped by the wall of the reaction equipment so as not to reach the substrate, with the result that $CH_3$ radicals alone are supplied onto the substrate surface. It follows that the $CH_3$ radicals permit carbon deposition on the substrate surface and, at the same time, nitrogen is also deposited on the substrate surface as a result of the reaction between the $CH_3$ radical and $NH_3$.

As described above, all the source gases can be decomposed on the substrate surface, though the substrate temperature is set at such a low level as 600 to 800° C. in the present invention. It follows that it is possible to control the supply rates of the source gases of B, C and N so as to control as desired the composition of the resultant BCN compound layer.

Further, in order to ensure a C-N bond, it is possible to use a source gas having a CN bond and decomposable at such a low temperature as 600 to 800° C. For example, it is possible to use a gas of a compound represented by a general formula, "M|CNCH$_2$|$_m$H$_n$", where M is a metal element, n is 0 or an integer of 1 or more, and m is an integer of 1 or more. A specific compound represented by this general formula includes, for example, (CNCH$_2$)$_2$AlH. If (CNCH$_2$)$_2$AlH, which is subjected to a thermal decomposition in advance, is supplied to a substrate surface, a component having a C—N bond can be deposited on the substrate surface, as given below:

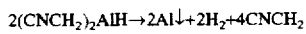

The most preferred embodiment of the method of the present invention can be summarized as follows:

(a) The substrate temperature should be set to fall within a range of between 600° C. and 800° C.

(b) The raw material gases introduced into the reaction chamber should include a carbon-containing gas represented by a general formula MR$_m$H$_n$, where M is a metal element, R is an organic group, n is 0 or an integer of 1 or more, and m is an integer of 1 or more, a boron-containing gas selected from the group consisting of B(CH$_3$)$_3$ and B(C$_2$H$_5$)$_3$, and an ammonia gas (NH$_3$) as a nitrogen-containing gas.

(c) The C-containing source gas, MR$_m$H$_n$, is subjected to a preliminary heating to permit the gas to be decomposed before the gas flows to reach the substrate such that the organic radicals resulting from decomposition of the gas are supplied to the substrate surface to achieve carbon deposition on the substrate surface, with the metal component of the gas deposited on the wall of the reaction equipment. At the same time, the B-containing source gas is decomposed on the substrate surface to achieve boron deposition on the substrate surface. Further, a reaction between NH$_3$ used as the N-containing gas and the organic radical generated from the C-containing gas is carried out on the substrate surface to achieve nitrogen deposition on the substrate surface, thereby achieving deposition of a BCN compound on the substrate surface.

EXAMPLES

Let us describe Examples of the present invention with reference to the accompanying drawings.

Example 1

In this experiment, a thin film of B$_x$C$_y$ (0<x<0.2; 1>y>0.8; x+y=1) was formed by a CVD method. A quartz tube having a diameter of 75 mm was used as a reaction tube, and a quartz plate was used as a substrate. A benzene gas and a BCl$_3$ gas were used as the source gases. The temperature within the reaction tube was set at 900° C. and the pressure within the reaction tube was maintained at 5 Torr. Under these conditions, the benzene gas and BCl$_3$ gas were supplied into the reaction tube at flow rates of 6 to 20 sccm and 0 to 80 sccm, respectively. It was possible to control the composition of the resultant thin film by controlling the flow rates of these gases.

After the film forming operation for about one hour, the supply of the source gases was stopped, followed by cooling the reaction tube to room temperature while allowing an Ar gas to flow within the reaction tube. The structure and composition of the resultant thin film were evaluated by an X-ray diffractometry, scanning Auger microscope, and X-ray absorption spectrum.

FIG. 3 is a graph showing the relationship between the boron concentration (at %) of the resultant thin film and the BCl$_3$ concentration (mol %) of the source gases. As seen from FIG. 3, the boron concentration was saturated at about 17 at % under the conditions described above. Where the thin film contained 17 at % of boron, the thin film was found to consist of BC$_5$ compound in which boron atoms (solid circles) and carbon atoms (open circles) were regularly arranged within a plane, as shown in FIG. 4. Where the boron concentration was lower than 17 at %, the boron and carbon atoms were found to be arranged at random. FIG. 5 is a graph showing the relationship between the boron concentration of the resultant film and the spacing d between (002) planes. As seen from FIG. 5, the spacing d is diminished with an increase in the boron concentration. Further, analysis of the X-ray absorption spectrum has indicated that all the boron atoms within the thin film are substituted in the positions of carbon atoms.

Also formed was a thin film of BC$_2$N$_2$ by a CVD method. In this experiment, CH$_3$CN and BCl$_3$ were used as source gases (reactant gases) together with a helium gas used as a carrier gas. The CH$_3$CN gas was dried first with a CaH$_2$ gas and, then, distilled for use in this experiment. The purity of the BCl$_3$ gas was 99.999%. The reaction temperature was set at 850° C. or 950° C. The partial pressures of the CH$_3$CN gas and BCl$_3$ gas were varied within ranges of between 0.14 Torr and 1.4 Torr and between 0.84 Torr and 8.4 Torr, respectively, with the total pressure including the He gas set at one atmosphere. Further, the deposition rate of the thin film was varied within a range of between 0.1 μm/hour and 7 μm/hour by controlling the total pressure of the two reactant gases while maintaining constant the ratio of the reactant gases. The thin film-forming operation was continued for 3 to 12 hours.

Figure 6:
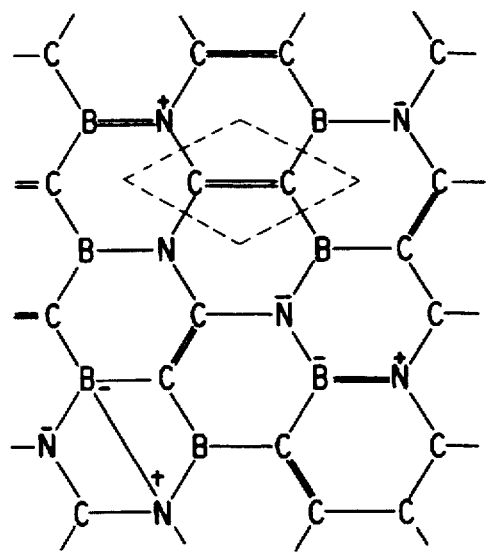
FIG. 6 shows the atomic arrangement in a plane of $BC_2N$ compound.

A chemical analysis of the resultant thin film indicated that the film contained 25 to 18 at % of B, 50 to 55 at % of C and 23 to 26 at % of N, supporting that the resultant thin film substantially consisted of BC$_2$N compound. On the other hand, the (002) reflection in the X-ray diffractometry indicated that the resultant BCN compound had a spacing of 0.345 nm. Further, analysis of an XPS (X-ray photoelectron spectroscopy) indicated that the resultant compound had an atomic arrangement in a plane as shown in FIG. 6, supporting that the compound had an ordered structure.

An electrical conductivity was measured by a four-probe method in respect of each of the B$_x$C$_y$ films and the BC$_2$N films. The temperature coefficient of the electrical conductivity was found to be negative in any of the B$_x$C$_y$ films, supporting that the BCN compound was metallic. To be more specific, the conductivity at room temperature was monotonously increased with an increase in the boron content x. Where the value of x in the general formula was about 0.2, the electrical conductivity of the compound was found to be about 10$^5$ Ω cm$^{-2}$, which was about 5 times as high as that of graphite, i.e., the compound where the value of x is zero. This suggests that the B$_x$C$_y$ compound is a semi-metal like graphite in which a band gap is not present. On the other hand, the temperature coefficient of the electrical conductivity was found to be positive in respect of each of the BC$_2$N films formed at 850° C. and 950° C. In other words, the BC$_2$N films exhibited semiconductor-like electrical conductivity. The band gap estimated from the temperature coefficient of the conductivity was 0.05 eV in each of the BC$_2$N films.

Further, the Hall effect was measured in respect of the BC$_2$N films. The thin film formed at 850° C. was found to exhibit an n-type conductivity (electron concentration of 2×10$^{15}$ cm$^{-3}$). On the other hand, the thin film formed at 950° C. was found to exhibit a p-type conductivity (hole concentration of 1×10$^{15}$ cm$^{-3}$). Still further, the carrier mobility was found to be 1.5×10$^3$ cm$^2$/Vsec for the thin film formed at 850° C. and $0.8 \times 10^3$ cm$^2$/Vsec for the thin film formed at 950° C.

Figure 7:
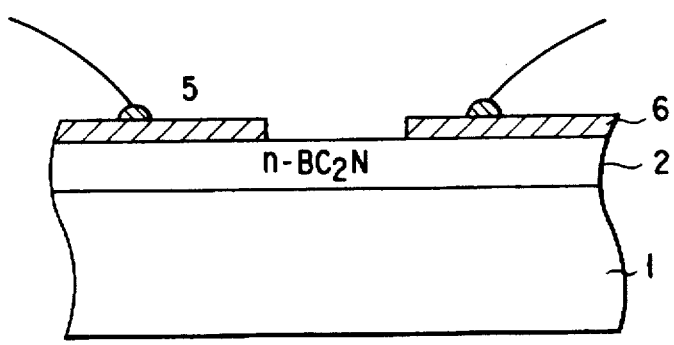
FIG. 7 is a cross sectional view showing the construction of a photoconductive-type semiconductor infrared detector in Example 1.

An infrared detector of a photoconduction type as shown in FIG. 7 can be prepared by using the BCN compounds of the present invention. Specifically, an n-type BC$_2$N layer 2 is deposited by a CVD method in a thickness of about 1 µm on a quartz substrate 1. Then, bonding pads 5 and 6 are formed a predetermined distance apart from each other on the n-type BC$_2$N layer 2. The region positioned between these bonding pads 5 and 6 acts as a light-receiving section.

Figure 8:
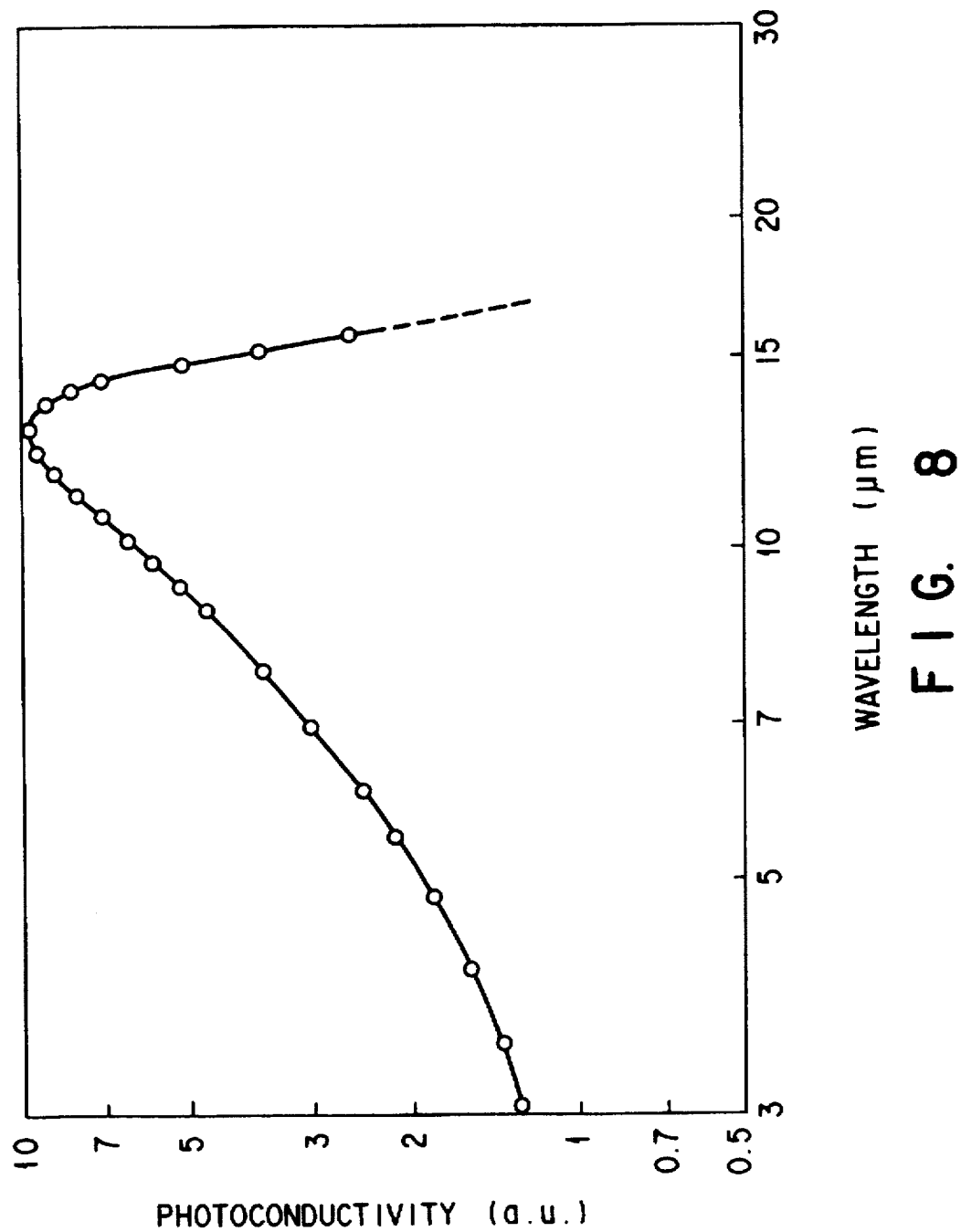
FIG. 8 shows the photoconductive characteristics of the detector shown in FIG. 7.

If a voltage is applied between these bonding pads 5 and 6 through lead wires so as to measure a current flowing through the light-receiving section, the current is increased upon irradiation with an infrared ray. It should be noted that the n-type BC$_2$N layer 2 is excited upon irradiation with an infrared ray so as to bring about flow of a photoconductive current. FIG. 8 is a graph showing how the infrared detector exhibits photoconductive response. As apparent from FIG. 8, a high photoconductivity is obtained in an infrared wavelength region of 5 to 15 µm, with a peak residing at a wavelength of 13 µm.

Figure 9:
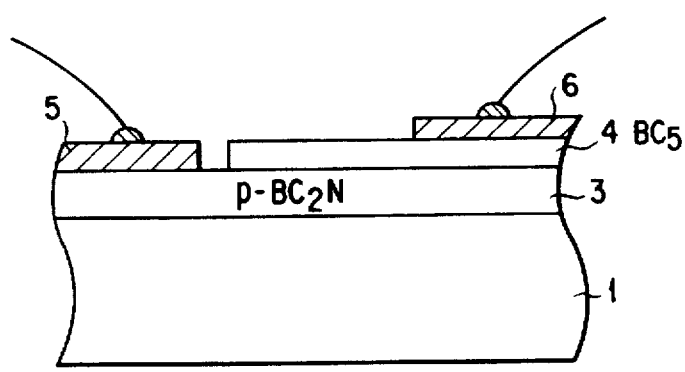
FIG. 9 is a cross sectional view showing the construction of a photovoltaic-type semiconductor infrared detector in Example 1.

Also, an infrared detector of a photovoltaic type as shown in FIG. 9 can be prepared. Specifically, a p-type BC$_2$N layer 3 is formed by a CVD method on a quartz substrate 1, followed by forming a BC$_5$ layer 4, which is a semi-metal, on the p-type BC$_2$N layer 3 and subsequently removing selectively a part of the BC$_5$ layer 4. Further, bonding pads 5 and 6 are formed on the exposed surface of the p-type BC$_2$N layer 3 and the BC$_5$ layer 4, respectively. That region of the BC$_5$ layer 4 which is interposed between these bonding pads 5 and 6 acts as a light-receiving section.

In the resultant detector, a Schottky contact is formed between the p-type BC$_2$N layer 3 and the BC$_5$ layer 4. It should be noted that the detector produces a photovoltaic force upon irradiation with an infrared ray. Also, a high photovoltaic force is obtained within an infrared wavelength region of 5 to 15 µm.

Example 2

Figure 10:
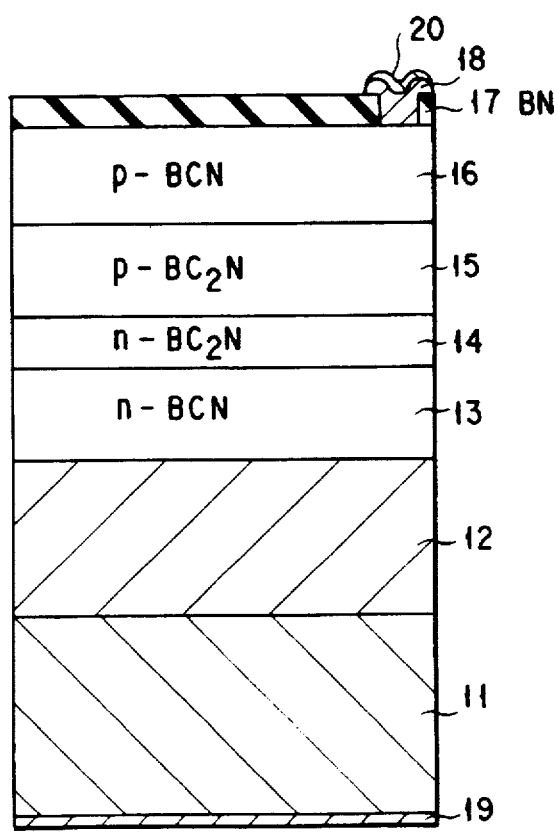
FIG. 10 is a cross sectional view showing the construction of a light-emitting diode in Example 2.

A light-emitting diode as shown in FIG. 10 is prepared as follows. As shown in FIG. 10, the diode comprises a substrate 11, which is made of graphite (Highly Oriented Pyrolytic Graphite: HOPG) and sized at 10 mm×10 mm×5 mm. The lattice spacing of the graphite as measured by an X-ray diffractometry is 0.333 nm. It has been confirmed that the graphite is highly oriented.

The graphite substrate 11 is put in a CVD apparatus and subjected to a heat treatment for the purifying purpose at about 1,000° C. for 6 hours under a vacuum of 10$^{-4}$ Pa. Then, the substrate temperature is set at 900° C. Under this condition, a methane (CH$_4$) gas as a carbon source is supplied into the CVD apparatus together with a carrier gas of Ar so as to grow a graphite layer 12 in a thickness of about 1 µm. Then, a BCl$_3$ gas (B source), a CH$_4$ gas (C source), a NH$_3$ gas (N source) and a H$_2$S gas (n-type dopant source) are supplied together with a carrier gas of Ar into the CVD apparatus to grow an n-type BCN layer 13 in a thickness of 1 µm, followed by growing an n-type BC$_2$N layer 14 in a thickness of 0.5 µm on the n-type BCN layer 13 by increasing the flow rate of the CH$_4$ gas. After formation of the layer 14, a BCl$_3$ gas, a CH$_4$ gas, a NH$_3$ gas and a Zn(C$_2$H$_5$)$_2$ gas (p-type dopant source) are supplied together with a carrier gas of Ar into the CVD apparatus to grow a p-type BC$_2$N layer 15 in a thickness of 0.3 µm, followed by growing a p-type BCN layer 16 in a thickness of 0.3 µm on the layer 15 by decreasing the flow rate of the CH$_4$ gas. The resultant structure is taken out of the CVD apparatus, and an electrode-forming region on a surface of the p-type BCN layer 16 is covered with a mask, followed by putting again the structure in the CVD apparatus. Under this condition, a BCl$_3$ gas and an NH$_3$ gas are supplied into the CVD apparatus together with an Ar gas to grow a boron nitride (BN) film 17 in a thickness of 0.1 µm on the surface of the layer 16. The resultant structure is taken out of the CVD apparatus again, and the mask used for forming the BN film 17 is removed. Then, the BN film 17 is covered with a mask except an electrode-forming region, followed by putting again the resultant structure in the CVD apparatus. Under this condition, a CH$_4$ gas is supplied into the CVD apparatus together with a carrier gas of Ar so as to grow a graphite electrode 18 in a thickness of 0.1 µm. After formation of the graphite electrode 18, the resultant structure is taken out of the CVD apparatus and, then, put in a vacuum evaporation apparatus to form a Au electrode 19 on the back surf ace of the graphite substrate 11 and a Au electrode 20 on the graphite electrode 18.

The composition, carrier concentration, etc. of ea c h of the BCN compounds are determined on the basis of a BCN compound single layer formed on a substrate under the conditions described above. The composition has been determined from the result of the XPS measurement. On the other hand, the carrier concentration has been determined from the result of measurement of the Hall effect at room temperature.

To be more specific, in the resultant light-emitting diode, the electron concentration in the n-type BCN layer 13 has been found to be $1 \times 10^{18}$ cm$^{-3}$; the electron concentration in the n-type BC$_2$N layer 14 has been found to be $2 \times 10$ cm$^{-3}$; the hole concentration in the p-type BC$_2$N layer 15 has been found to be $5 \times 10^{16}$ cm$^{-3}$; and the hole concentration in the p-type BCN layer 16 has been found to be $1 \times 10^{18}$ cm$^{-3}$. In this light-emitting diode, light is emitted from the n-type BC$_2$N layer 14 and the p-type BC$_2$N layer 15, said layers 14 and 15 forming a pn junction. On the other hand, the n-type BCN layer 13 and the p-type BCN layer 16 having the light-emitting layers 14 and 15 sandwiched therebetween have band gaps greater than those of the light-emitting layers 14, 15 and perform functions of confining the carriers (electrons and holes) to the light-emitting layers 14, 15.

When a forward bias voltage of 3V is applied across the resultant light-emitting diode, a current of 10 mA has been found to flow therethrough so as to emit light having a wavelength of 620 nm. Also, the light-emitting efficiency has been found to be 8%.

Example 3

A semiconductor laser constructed as shown in FIG. 11 is prepared as follows. A BC$_3$ compound used in this experiment has been confirmed to be a metal by the fact that the temperature coefficient of the electrical conductivity of the compound is negative.

As seen from FIG. 11, the semiconductor laser comprises a substrate 21, which is made of graphite and sized at 10 mm×10 mm×1 mm. The graphite substrate 21 is put in a CVD apparatus and heated at about 1,000° C. for 6 hours under a vacuum of 10$^{-4}$ Pa for purification. The substrate temperature is set at 900° C. Then, a CN$_5$ layer 22 having a thickness of 0.3 µm, an n-type BC$_4$N layer 23 having a thickness of 0.5 µm (electron concentration of about 10$^{18}$ cm$^{-3}$), an n-type BC$_2$N layer 24 having a thickness of 2 µm (electron concentration of about $5 \times 10^{17}$ cm$^{-3}$), an undoped BC$_4$N layer 25 having a thickness of 0.1 µm (electron concentration of about 10$^{15}$ cm$^{-3}$), a p-type BC$_2$N layer 26 having a thickness of 1.2 µm (hole concentration of about 10$^{18}$ cm$^{-3}$), and a p-type BC$_4$N layer 27 having a thickness of 0.3 µm (hole concentration of about $5 \times 10^{18}$ cm$^{-3}$) are successively formed in this order on the substrate 21 by suitably selecting the reactant gases of $BCl_3$ (B source), $CH_4$ (C source), $NH_3$ (N source) and dopant sources of $H_2S$ (n-type dopant source) and $Zn(C_2H_5)_2$ (p-type dopant source), as in Example 2.

After formation of the p-type $BC_4N$ layer 27, the resultant structure is taken out of the CVD apparatus. The layer 27 is covered with a mask having striped openings, followed by putting again the resultant structure in the CVD apparatus for forming selectively a $BC_3$ layer 28 having a thickness of 0.2 μm on the p-type $BC_4N$ layer 27 and subsequently forming a graphite layer 29 having a thickness of 0.1 μm on the layer 28. The resultant structure is taken again out of the CVD apparatus for removing the mask. Then, the resultant structure is selectively cut by a scriber to a depth of 3 μm to form a mesa structure having clean edge surfaces, thereby to set the length of a resonator at 250 μm.

The resultant structure is put again in the CVD apparatus, followed by supplying reactant gases of $BCl_3$ and $NH_3$ together with a carrier gas of Ar into the CVD apparatus to achieve growth of an h-BN layer 30 in a manner to cover the entire circumferential surface of the structure. Since the electrode-forming regions are also covered with the h-BN layer 30, the resultant structure is taken out of the CVD apparatus for cleaving the graphite substrate 21 and the graphite layer 29 so as to expose clean graphite surfaces to the outside. Then, the resultant structure is put in a vacuum evaporation apparatus so as to form a Au electrode 31 on the back surface of the graphite substrate 21 and a Au electrode 32 on the upper surface of the graphite layer 29, thereby to obtain a desired semiconductor laser constructed as shown in FIG. 11.

The resultant semiconductor laser is of a double heterojunction structure formed by the undoped $BC_4N$ layer 25 acting as a light-emitting layer (active layer) and the n- and p-type $BC_2N$ layers 24 and 26 acting as cladding layers and having the undoped layer 25 sandwiched therebetween. It should be noted that the edge surfaces of these light-emitting layer and cladding layers form resonating planes.

Figure 12:
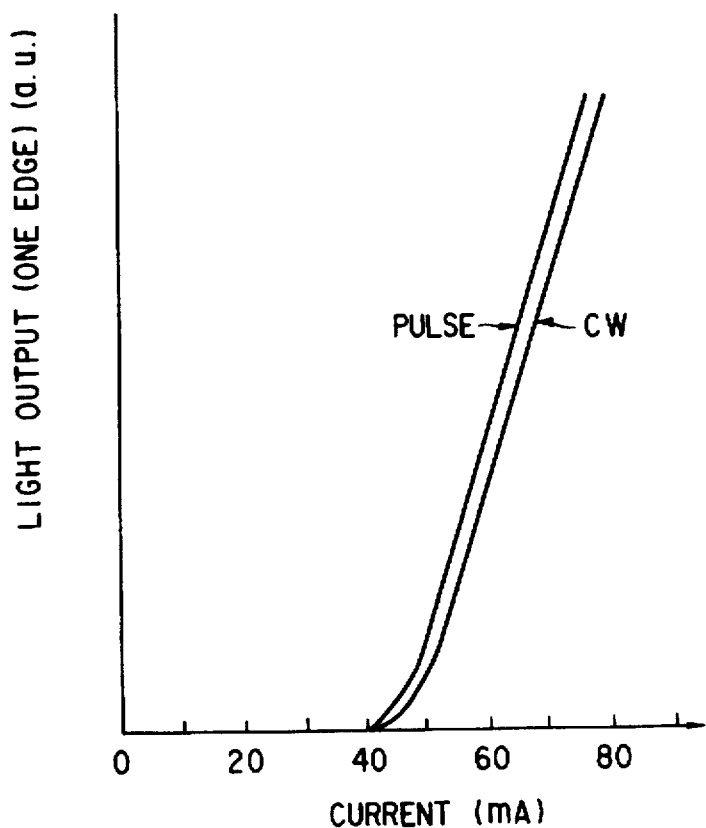
FIG. 12 is a graph showing the current-light output characteristics in respect of the continuous wave (CW) oscillation and pulse oscillation in the semiconductor laser shown in FIG. 11.
Figure 13:
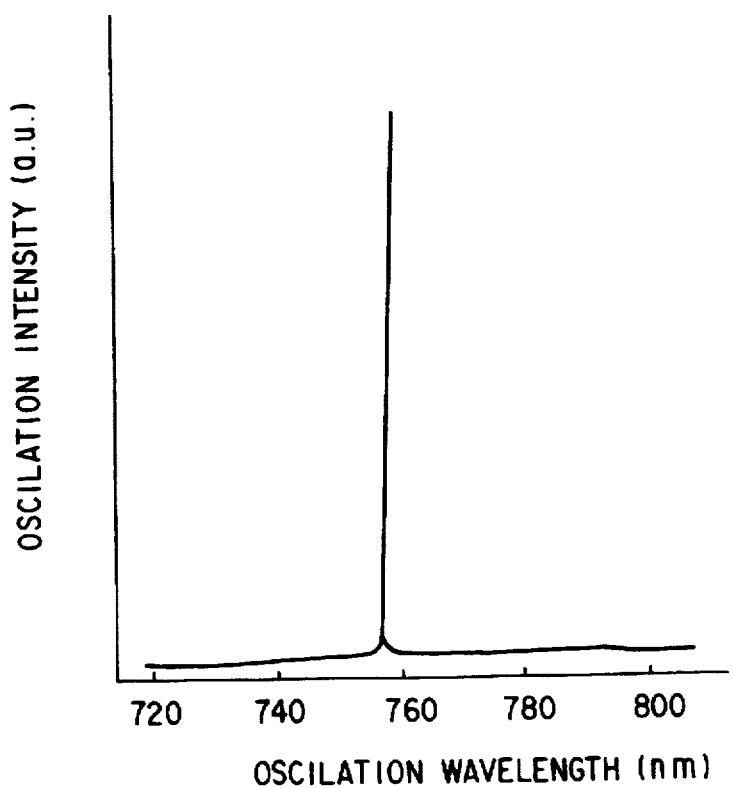
FIG. 13 shows the oscillation spectrum of the semiconductor laser shown in FIG. 11.

The current-light output characteristics of the semiconductor laser are measured, with the result as shown in FIG. 12. Specifically, FIG. 12 is a graph showing the relationship between the current and light output in respect of each of the continuous wave (CW) oscillation and pulse oscillation. As seen from FIG. 12 obtained are satisfactory current-light output characteristics free from kinks. Further, FIG. 13 is an oscillation spectrum showing the dependence of the oscillation intensity on the oscillation wavelength. As apparent from FIG. 13 a single peak is observed in each of the far-field pattern and near-field pattern, supporting that it is possible to achieve a good mode control.

Incidentally, it is possible to manufacture an MQW type semiconductor laser by forming a light-emitting layer comprising a plurality of quantum wells which are stacked one upon the other.

Example 4

Figure 14:
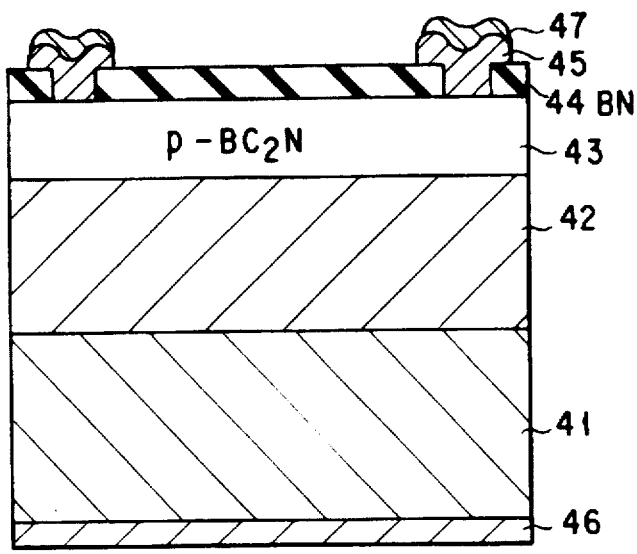
FIG. 14 is a cross sectional view of a solar cell in Example 4.

A solar cell as shown in FIG. 14 is prepared as follows. Specifically, a graphite substrate 41 sized at 20 mm×20 mm×2 mm is put in a CVD apparatus and heated at about 1,000° C. for one hour under a vacuum of $10^{-1}$ Pa for purification. The substrate temperature is set at 900° C. Under this condition, a methane gas ($CH_4$) is introduced together with a carrier gas of He into the CVD apparatus so as to grow a graphite layer 42 in a thickness of about 1 μm. Then, reactant gases of $BCl_3$ (B source) and $CH_3CN$ (acetonitrile as C and N sources) are supplied together with a carrier gas of He into the CVD apparatus under a pressure of 1 Pa. In this step, the flow rate of each of these reactant gases is controlled by a mass flow controller at 0.1 cc/min so as to grow a p-type $BC_2N$ layer 43 in a thickness of 0.5 μm. The deposition rate of the layer 43 is 1 μm/hour. After formation of the layer 43, the resultant structure is taken out of the CVD apparatus so as to cover electrode-forming regions on the surface of the p-type $BC_2N$ layer 43 with a mask. Then, the resultant structure is put again in the CVD apparatus, followed by supplying reactant gases of $BCl_3$ and $NH_3$ together with a carrier gas of He into the CVD apparatus so as to grow a BN layer 44 in a thickness of 0.1 μm. Further, the resultant structure is taken again out of the CVD apparatus for removing the mask, followed by covering again the upper surface of the BN compound layer 44 except the electrode-forming regions with a mask. The resultant structure under this condition is put again in the CVD apparatus, followed by supplying a methane gas ($CH_4$) together with a carrier gas of He into the CVD apparatus so as to grow a graphite electrode 45 in a thickness of 0.2 μm. The resultant structure is taken out of the CVD apparatus and, then, put in a vacuum evaporation apparatus so as to form a Au electrode 46 on the back surface of the graphite substrate 41 and another Au electrode 47 on the upper surface of the graphite electrode 45. Further, these Au electrodes 46 and 47 are connected to lead wires using a Ag paste.

The p-type $BC_2N$ layer 43, which performs the function of a light-absorbing layer, of the resultant solar cell is found to have a hole concentration of $5 \times 10^{18}$ cm$^{-3}$ and a mobility of 120 cm$^2$/Vsec. In this solar cell, a Schottky contact is formed between the lower surface of the light-absorbing layer 43 and the graphite layer 42 and between the upper surface of the light-absorbing layer 43 and the graphite electrode 45.

Figure 15:
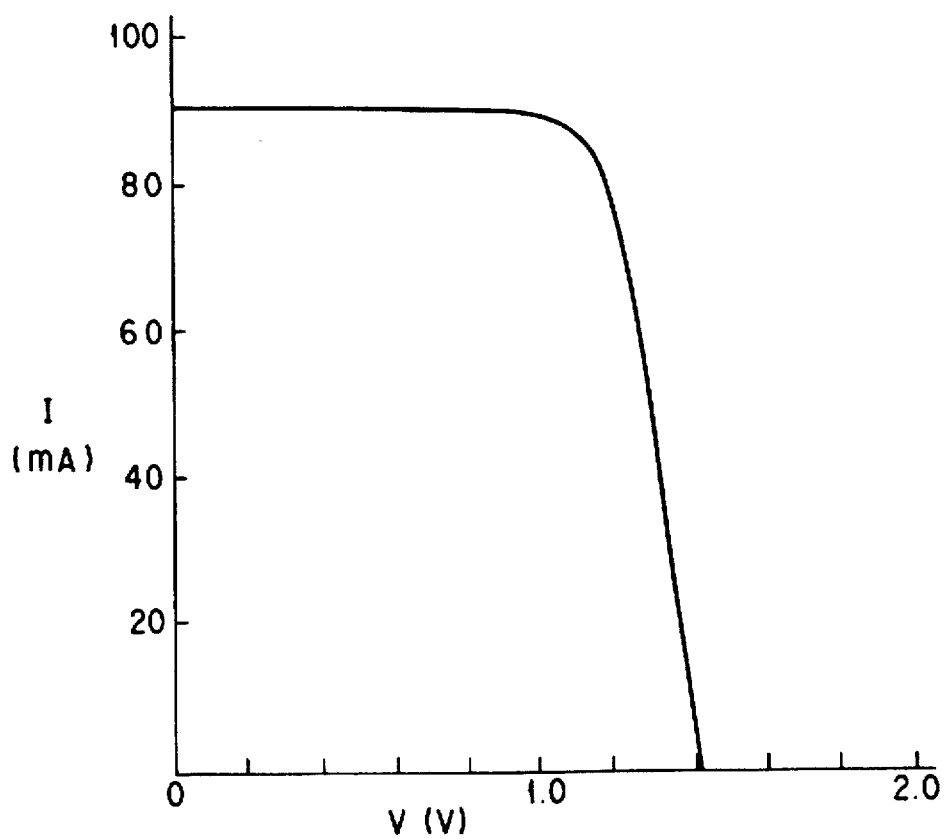
FIG. 15 shows the I-V characteristics of the solar cell shown in FIG. 14.

The solar cell is irradiated with sunlight for measuring the characteristics thereof. A typical curve of characteristics is obtained as shown in FIG. 15. Further, when irradiated with light of 100 mW/cm$^2$, obtained is a power output of 50 mW. The conversion efficiency is found to be 12.5%.

Example 5

A solar cell as shown in FIG. 16 is prepared as follows. Specifically, a graphite substrate 51 sized at 20 mm×20 mm×2 mm is put in a CVD apparatus and heated at about 1,000° C. for one hour under a vacuum of $10^{-4}$ Pa for purification. The substrate temperature is set at 900° C. Under this condition, reactant gases consisting of a $BCl_3$ gas (B source) and a $C_6H_6$ gas (C source) are supplied together with a carrier gas of He into the CVD apparatus to grow a $BC_3$ layer 52 in a thickness of about 1 μm. In this step, the flow rate of each of these reactant gases is set at 0.1 cc/min by using a mass flow controller.

In the next step, a p-type $BC_4N$ layer 53 having a thickness of 0.2 μm, an n-type $BC_4N$ layer 54 having a thickness of 0.1 μm, an n-type $BC_3N$ layer 55 having a thickness of 0.1 μm, an n-type $BC_{2.5}N$ layer 56 having a thickness of 0.1 μm, an n-type $BC_2N$ layer 57 having a thickness of 0.1 μm, and an n-type BCN layer 58 having a thickness of 0.1 μm are successively formed in this order on the $BC_3$ layer 52 by suitably selecting the reactant gases of $BCl_3$ (B source), $C_6H_6$ (C source), $NH_3$ (N source), S (n-type dopant) and Be (p-type dopant), which are supplied together with a carrier gas of He.

After growth of the n-type BCN layer 58, the resultant structure is taken out of the CVD apparatus for covering electrode-forming regions in the upper surface of the layer 58 with a mask, followed by putting again the resultant structure in the CVD apparatus. Then, reactant gases of $BCl_3$ and NH₃ are supplied together with a carrier gas of He into the CVD apparatus to achieve growth of an h-BN film 59 having a thickness of 0.1 μm on the n-type BCN layer 58. After formation of the film 59, the resultant structure is taken out of the CVD apparatus so as to remove the mask, followed by covering the upper surface of the h-BN film 59 except electrode-forming regions with a mask. The resultant structure is put again in the CVD apparatus, and a methane (CH₄) gas is supplied together with a carrier gas of He into the CVD apparatus so as to grow a graphite electrode 60 having a thickness of 0.2 μm. Then, the resultant structure is taken out of the CVD apparatus and put in a vacuum evaporation apparatus so as to form a Au electrode 61 on the back surface of the graphite substrate 51 and a Au electrode 62 on the upper surface of the graphite electrode 60. Finally, these Au electrodes 61 and 62 are connected to lead wires using a Ag paste so as to obtain a desired solar cell.

In the resultant solar cell, a pn junction is formed between the p-type BC₄N layer 53 and the n-type BC₄N layer 54. The hole concentration in the p-type BC₄N layer 53 is found to be $2 \times 10^{18}$ cm⁻³. On the other hand, the electron concentrations in the n-type BCN layers are found to be: $1 \times 10^{16}$ cm⁻³ for the n-type BC₄N layer 54; $3 \times 10^{16}$ cm⁻³ for the n-type BC₃N layer 55, $5 \times 10^{16}$ cm⁻³ for the n-type BC₂.₅N layer 56; $1 \times 10^{17}$ cm⁻³ for the n-type BC₂N layer 57; and $2 \times 10^{17}$ cm⁻³ for the n-type BCN layer 58. FIG. 17 shows a band diagram of the solar cell. As shown in FIG. 17, the band gap is increased toward the surface and decreased toward the inner region in the resultant solar cell. It follows that the solar cell permits absorbing light having a wide wavelength range, leading to an improved conversion efficiency.

The solar cell is irradiated with sunlight for measuring the characteristics thereof. A typical curve of characteristics is obtained as shown in FIG. 18. Further, when irradiated with light of 100 mW/cm², obtained is a power output of 90 mW. The conversion efficiency is found to be 23%.

Example 6

Prepared is a heterojunction field effect transistor constructed as shown in FIG. 19.

The heterojunction field effect transistor comprises a first semiconductor BCN compound layer having a relatively small band gap and a low impurity concentration, a second semiconductor BCN compound layer having a relatively large band gap and a high impurity concentration, said first and second semiconductor BCN compound layers differing from each other in composition to form a heterojunction, source and drain electrodes formed on a surface of said second semiconductor BCN compound layer, and a Schottky gate electrode formed between said source and drain electrodes. The transistor of the particular construction is generally called a high electron mobility transistor (HEMT).

In preparing the heterojunction field effect transistor as shown in FIG. 19, a BN substrate 71 sized at 10 mm×10 mm×5 mm is put in a CVD apparatus and heated at about 1,000° C. for 6 hours under a vacuum of 10⁻⁴ Pa for purification. The substrate temperature is set at 900° C. Under this condition, reactant gases consisting of a BCl₃ gas (B source) and an NH₃ gas (N source) are supplied together with a carrier gas of Ar into the CVD apparatus to grow a BN layer 72 in a thickness of about 1 μm. Then, reactant gases consisting of a BCl₃ gas (B source), a HC₄ gas (C source) and an NH₃ gas (N source) are supplied together with a carrier gas of Ar into the CVD apparatus to grow an undoped BC₄N layer 73 in a thickness of about 0.5 μm on the BN layer 72, followed by decreasing the flow rate of the CH₄ gas to grow an undoped BC₂N layer 74 in a thickness of about 5 nm on the BC₄N layer 73. Further, an n-type dopant source of an H₂S gas is also supplied together with the reactant gases and the carrier gas noted above into the CVD apparatus to grow an n-type BC₂N layer 75 in a thickness of 20 nm on the undoped BC₂N layer 74. The electron concentration of the n-type BC₂N layer 75 is found to be $6 \times 10^{17}$ cm⁻³.

The resultant structure is taken out of the CVD apparatus to cover the surface of the n-type BC₂N layer 75 except at regions for forming source and drain electrodes with a mask, followed by forming on the layer 75 a laminate structure consisting of a Ni film 50 nm thick and a AuGe film 50 nm thick by a sputtering method. The laminate structure is heated at 450° C. for 30 minutes so as to achieve an ohmic contact with the n-type BC₂N layer 75, thereby forming source and drain electrodes 76, 77. After formation of these electrodes 76, 77, the mask was removed, followed by covering the surface of the layer 75 except a gate electrode-forming region with a mask. Then, a laminate structure consisting of an Al film 100 nm thick and a Ti film 100 nm thick is formed on the n-type BC₂N layer 75 by vacuum evaporation so as to form a gate electrode 78 forming a Schottky contact with the layer 75.

In the resultant HEMT, a heterojunction is formed between the undoped BC₄N layer 73 and the undoped BC₂N layer 74. However, the BC₄N compound and the BC₂N compound are close to each other in the lattice constant. Therefore, strain or defects are unlikely to take place, with the result that an interfacial level is unlikely to be formed in the heterojunction.

The electron density and mobility of the two dimensional electron gas of the HEMT are measured at 77K. The electron density is found to be $5 \times 10^{11}$ cm⁻³. Also, the mobility is found to be 130,000 cm²/Vsec. Further, the resultant HEMT, which is of an enhancement type, is found to exhibit a mutual conductance of 200 mS/mm at 300K and 550 mS/mm at 77K.

Example 7

Prepared is a heterojunction bipolar transistor (HBT) as shown in FIG. 20. As seen from FIG. 20, the heterojunction bipolar transistor comprises a collector region formed of a semiconductor BCN compound of a first conductivity type, a base region formed of a semiconductor BCN compound having a second conductivity type and a relatively small band gap, and an emitter region formed of a semiconductor BCN compound having the first conductivity type and having a relatively large band gap. In this transistor, a heterojunction is formed between the base region and the emitter region differing in composition from the base region.

In preparing the heterojunction bipolar transistor as shown in FIG. 20, a graphite substrate 81 is put in a CVD apparatus and heated at about 1,000° C. for 6 hours under a vacuum of 10⁻⁴ Pa for purification. The substrate temperature is set at 900° C. Under this condition, reactant gases consisting of a BCl₃ gas (B source), a CH₄ gas (C source) and an NH₃ gas (N source) are supplied together with an n-type dopant source of H₂S and a carrier gas of Ar into the CVD apparatus to grow an n-type BC₂N layer 82 (electron density of $10^{17}$ cm⁻³) forming a collector region in a thickness of about 2 μm. Then, the dopant gas is switched to a p-type dopant source of Zn(C₂H₅)₂ to grow a p-type BC₂N layer 83 (hole density of $10^{19}$ cm⁻³ forming a base region in a thickness of about 50 nm. Further, the dopant gas is switched again to H₂S, and the flow rate of the CH₄ gas is lowered, so as to grow an n-type BCN layer 84 (electron density of $10^{17}$ cm⁻³) forming an emitter region in a thickness of about 0.5 μm.

The resultant structure is taken out of the CVD apparatus, and the n-type BCN layer 84 is partly cut off by a scriber to form a mesa structure so as to expose partially the p-type $BC_2N$ layer 83 forming the base region. Then, each of the upper surface of the n-type BCN layer 84 except an electrode-forming region and the exposed surface of the p-type $BC_2N$ layer 83 except an electrode-forming region is covered with a mask, followed by forming a laminate structure consisting of a Ni film 50 nm thick and a AuGe film 50 nm thick by means of a sputtering method. The laminate structure is heated at 450° C. for 30 minutes for achieving an ohmic contact with the n-type BCN layer 84 and the n-type $BC_2N$ layer 83, thereby forming a base electrode 85 and an emitter electrode 86. After formation of these electrodes 85 and 86, the mask is removed, followed by forming a collector electrode 87 on the back surface of the graphite substrate 81 by vacuum evaporation of Au.

In the resultant HBT, a heterojunction is formed between the p-type $BC_2N$ layer 83 and the n-type BCN layer 84. However, since the $BC_2N$ compound and the BCN compound are close to each other in the lattice constant, strains and defects are unlikely to take place, with the result that an interfacial level is unlikely to be formed in the heterojunction.

The emitter-grounded amplification factor of the resultant HBT is found to be as high as 1100.

Example 8

Prepared is an MIS field effect transistor (MISFET) as shown in FIG. 21. As seen from FIG. 21, the MIS field effect transistor comprises a semiconductor BCN compound layer of a first conductivity type, source and drain regions formed of a semiconductor BCN compound of a second conductivity type and positioned apart from each other in a surface region of the semiconductor BCN compound layer of the first conductivity type, a gate insulating film formed to cover a channel region between the source and drain regions in a surface region of the semiconductor BCN compound layer of the first conductivity type, and a gate electrode formed on the gate insulating film.

In preparing the MIS field effect transistor, a BN substrate 91 sized at 10 mm×10 mm×5 mm is put in a CVD apparatus and heated at about 1,000° C. for 6 hours under a vacuum of $10^{-4}$ Pa for purification. The substrate temperature is set at 900° C. Under this condition, reactant gases of $BCl_3$, $CCl_4$ and $NH_3$ are supplied together with a carrier gas of Ar into the CVD apparatus to grow a p-type $BC_2N$ layer 92 (hole concentration of $10^{15}$ cm$^{-3}$) in a thickness of about 1 μm. The resultant structure is taken out of the CVD apparatus to cover the surface of the p-type $BC_2N$ layer 92 with a mask except regions for forming source and drain regions. After formation of the mask, the resultant structure is put again in the CVD apparatus, and reactant gases of $BCl_3$, $CCl_4$, $NH_3$ and an n-type dopant source of $H_2S$ are supplied together with a carrier gas of Ar into the CVD apparatus to grow n-type $BC_2N$ layers 93 and 94 (electron concentration of $10^{17}$ cm$^{-3}$) forming source and drain regions.

The resultant structure is taken out of the CVD apparatus for removing the mask, followed by covering each of the n-type $BC_2N$ layers 93 and 94 with a mask and subsequently putting the resultant structure in the CVD apparatus. Under this condition, reactant gases of $BCl_3$, $CCl_4$ and $NH_3$ are supplied together with a carrier gas of Ar into the CVD apparatus to grow an additional p-type $BC_2N$ layer 92 in a thickness of about 0.1 μm on the p-type $BC_2N$ layer 92 formed previously. Then, supply of the $CCl_4$ gas is stopped to grow a BN film 95 having a thickness of 50 nm on the p-type $BC_2N$ layer 92 to form a gate insulating film. After formation of the BN film 95, the resultant structure is taken out of the CVD apparatus to remove the mask, followed by covering the surface of the resultant structure with a new mask except a gate electrode-forming region. Under this condition, reactant gases of $BCl_3$ and $CCl_4$ are supplied together with a carrier gas of Ar into the CVD apparatus to grow a $BC_3$ gate electrode 96 on the BN film 95. The resultant structure is taken out of the CVD apparatus for removing the mask, followed by covering the surface of the structure with a mask except the regions for forming source and drain electrodes and subsequently forming a laminate structure consisting of a Ni film and a AuGe film so as to form source and drain electrodes 97, 98.

In the resultant MISFET, the p-type $BC_2N$ layer 92 and the BN film 95 are close to each other in lattice constant. As a result, strains or defects are unlikely to be generated and, thus, an interfacial level is unlikely to be formed at the interface between the layer 92 and film 95. It should also be noted that boron nitride (BN) is superior in insulating properties to silicon dioxide ($SiO_2$) which is generally used for forming a gate insulating film. In addition, since BN is a compound of layered structure, the thickness of the BN film can be controlled in units of a single atomic layer, making it possible to make the gate insulating film uniform in thickness.

A voltage is applied to the $BC_3$ electrode 96, i.e., the gate electrode of the MISFET, with the result that an inversion layer is found to have been formed in the channel region below the gate insulating film of the BN film 95. Further, the mutual conductance of the MISFET is found to be 70 mS/mm at 300K.

Example 9

Prepared is a field emission device (field emitter or vacuum microdevice) as shown in FIG. 22. The field emission device comprises a needle-like emitter made of a BCN compound, a collector electrode arranged to face the tip of the emitter, and a gate electrode arranged to surround the tip of the emitter.

In preparing the field emission device, a graphite substrate 101 sized at 10 mm×10 mm×5 mm is put in a CVD apparatus and heated at about 1,000° C. for 6 hours under a vacuum of $10^{-4}$ Pa for purification. The substrate temperature is set at 900° C. Under this condition, a predetermined region of the substrate 101 is covered with a metal mask, and reactant gases of $BCl_3$ and $NH_3$ are supplied together with a carrier gas of Ar into the CVD apparatus to grow a predetermined pattern of a BN layer 102 in a thickness of 0.5 μm. The resultant structure is taken out of the CVD apparatus, followed by forming a gate electrode 103 on the BN layer 102 by means of vacuum evaporation of tungsten (W). Likewise, an emitter electrode 104 is formed on the back surface of the graphite substrate 101 by means of vacuum evaporation of W. In this fashion, circular spaces each having a diameter of 1 μm are formed among gate electrodes 103 to form a pattern of 5 (columns)×5 (rows). Then, the mask is removed, and the resultant structure is put again in the CVD apparatus. Under this condition, reactant gases of $C_2H_5$ and $NH_3$ are supplied together with a carrier gas of Ar into the CVD apparatus so as to form $C_3N_4$ emitters 105 each having a needle-like tip portion in the circular spaces formed among gate electrodes 103. Naturally, these emitters, 105 are arranged to form an array of 5 (columns)×5 (rows). On the other hand, a phosphor plate 109 is prepared by coating a surface of a glass substrate 106 with ITO to form a collector electrode 107 and, then, with phosphorus to form a phosphor layer 108. The resultant phosphor plate 109 is disposed on the graphite substrate 101 such that the $C_3N_4$ emitters 105 on the graphite substrate 101 are faced to the phosphor layer 108 of the phosphor plate 109. The inner pressure of the device is reduced to a vacuum of $10^{-5}$ Pa so as to prepare a desired field emission device.

The $C_3N_4$ emitter 105 included in the resultant field emission device has a high hardness, is thermally stable, and exhibits a high durability. In addition, the $C_3N_4$ emitter 105 has an electrical conductivity higher than that of the emitter made of a general semiconductor material. It follows that the field emission device thus prepared permits increasing the field emission current.

Figure 23:
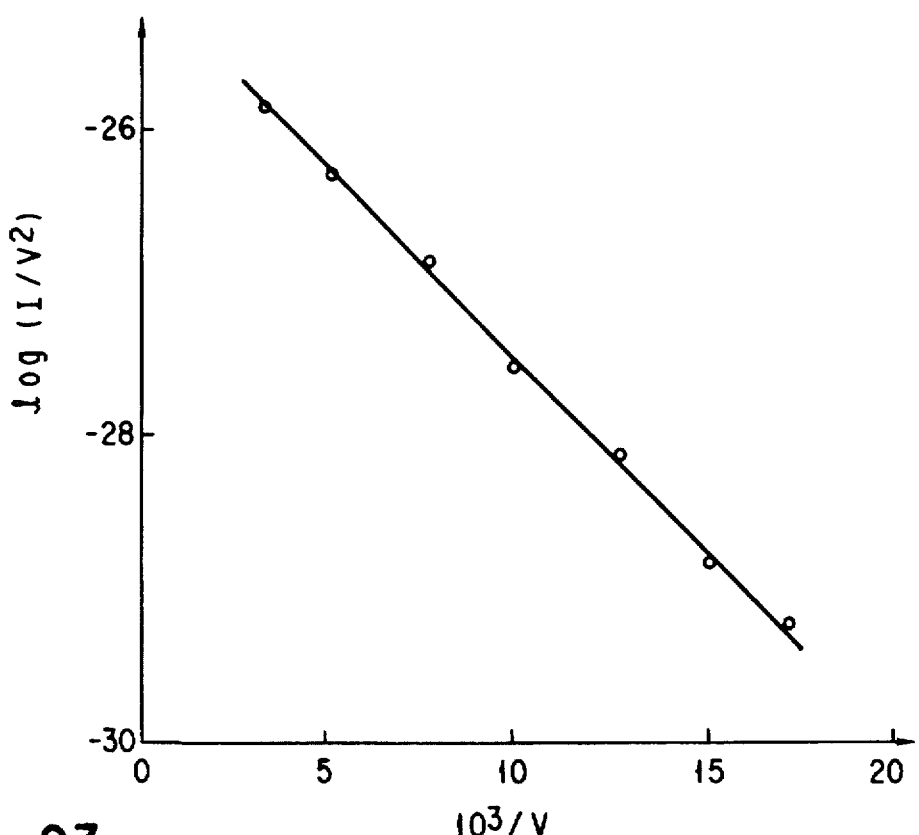
FIG. 23 shows the Fowler-Nordheim plot of the field emitter array shown in FIG. 22.

A voltage of 20V is applied to the gate electrode 103 of the resultant field emission device, with the voltage of the emitter electrode set at 0V. When a voltage of 50V or higher is applied under this condition between the emitter electrode 105 and the ITO collector electrode 107, a current is allowed to flow through the ITO collector electrode 107, with the result that light emission from the phosphor plate 109 is visually observed. FIG. 23 shows the Fowler-Nordheim plot indicating the collector voltage vs. emission current. A good linearity of the graph in FIG. 23 indicates that the field emission is predominant.

Example 10

Figure 24:
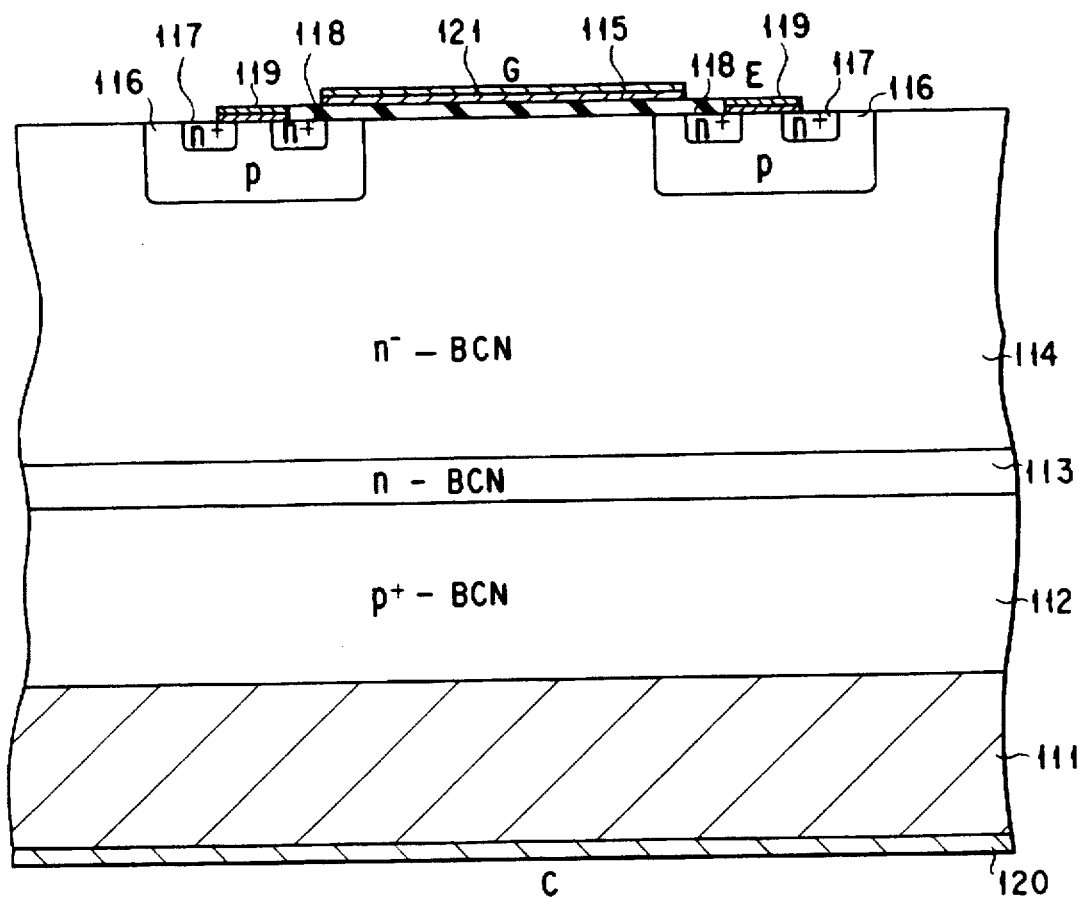
FIG. 24 is a cross sectional view showing the construction of a power transistor in Example 10.

Prepared is a power transistor of an IGBT (Insulated Gate Bipolar Transistor) type as shown in FIG. 24. The power transistor comprises a collector region formed of a semiconductor BCN compound of a first conductivity type, a base region formed of a semiconductor BCN compound of a second conductivity type, a first emitter region formed of a semiconductor BCN compound of the first conductivity type, a second emitter region formed inside the first emitter region and consisting of a semiconductor BCN compound of the first conductivity type, an emitter electrode connecting these first and second emitter regions, and a gate electrode covering the collector region, the base region and the second emitter region with a gate insulating film interposed therebetween.

In preparing the power transistor, a graphite substrate 111 sized at 50 mm×50 mm×5 mm is put in a CVD apparatus and heated at about 1,000° C. for 6 hours under a vacuum of $10^{-4}$ Pa for purification. The substrate temperature is set at 900° C. Under this condition, reactant gases of $BCl_3$, $CH_4$, $NH_3$ and a p-type dopant source of $Zn(C_2H_5)_2$ are supplied together with a carrier gas of Ar into the CVD apparatus to grow a $p^+$-type BCN layer 112 (hole concentration of $10^{19}$ $cm^{-3}$) in a thickness of 500 μm, followed by changing the dopant gas to an n-type dopant source of $H_2S$ so as to grow an n-type BCN layer 113 (electron concentration of $10^{17}$ $cm^{-3}$) in a thickness of 10 μm. Then, the flow rate of the $H_2S$ gas is decreased so as to grow an $n^-$-type BCN layer 114 (electron concentration of $2 \times 10^{15}$ $cm^{-3}$) in a thickness of 50 μm. After formation of the $n^-$-type BCN layer 114, supply of the $NH_3$ gas and $H_2S$ gas is stopped so as to grow a BN layer 115 in a thickness of 20 nm.

In the next step, Be ions as a p-type dopant are selectively implanted into the $n^-$-type BCN layer 114 so as to form an annular p-type diffusion layer 116 having an outer diameter of 30 μm and an inner diameter of 10 μm. Then, Si ions are selectively implanted into the annular p-type diffusion layer 116 so as to form an annular $n^+$-type diffusion layer 117 having an outer diameter of 27 μm and an inner diameter of 23 μm and another annular $n^+$-type diffusion layer 118 having an outer diameter of 17 μm and an inner diameter of 13 μm. Further, the BN layer 115 is selectively etched to form a contact hole for an emitter electrode, followed by forming a laminate structure consisting of a Ni film and a AuGe film by means of a sputtering method to fill the contact hole, thereby forming an emitter electrode 119. After formation of the emitter electrode 119, a collector electrode 120 is formed on the back surface of the graphite substrate 111 by means of vacuum evaporation of Au. Then, the resultant structure is heated at 500° C. for 5 hours so as to bring the electrodes into ohmic contact with the semiconductor layers and graphite substrate and to activate the dopant ions. Finally, a laminate structure consisting of an Al film and a Ti film is formed on the BN layer 115 positioned inside the annular p-type diffusion layer 116 by means of sputtering method, thereby forming a gate electrode 121 having a diameter of 11 μm.

It should be noted that BCN having a large band gap is used in the resultant IGBT. In addition, BN having high insulating properties is used for forming an insulating film. It follows that the transistor exhibits a high breakdown voltage. Further, since these BCN and BN have high melting points and are thermally stable, it is possible to suppress deterioration when used as a power transistor.

Figure 25:
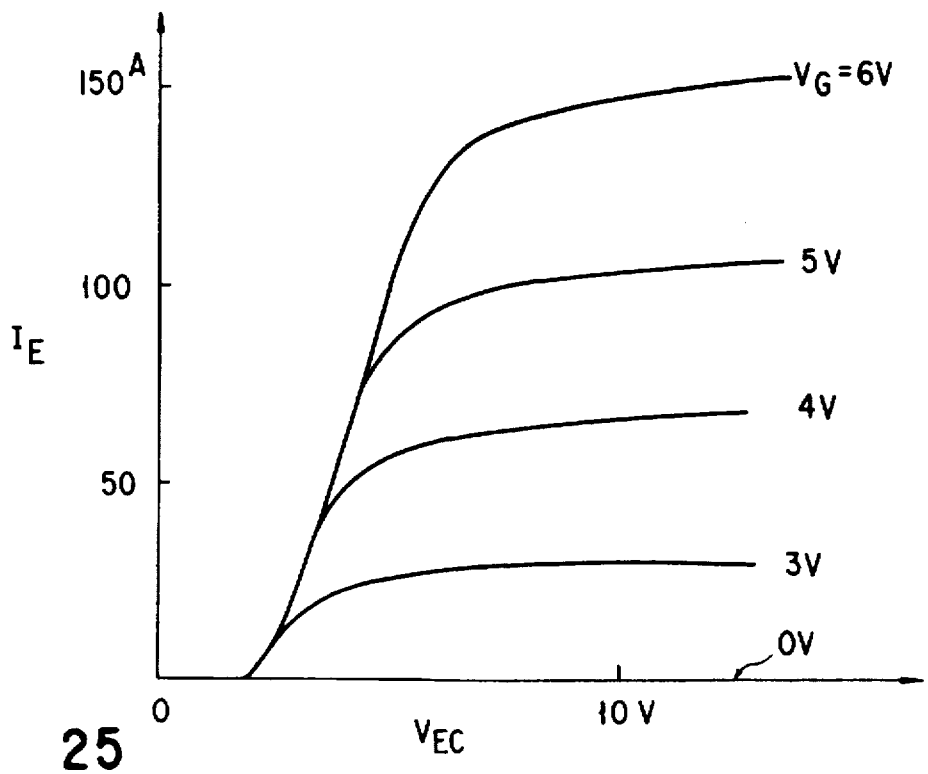
FIG. 25 shows the I-V characteristics of the power transistor shown in FIG. 24.

Transistor characteristics of the resultant IGBT are shown in FIG. 25. The resultant power transistor exhibits an excellent performance.

Example 11

Figure 26:
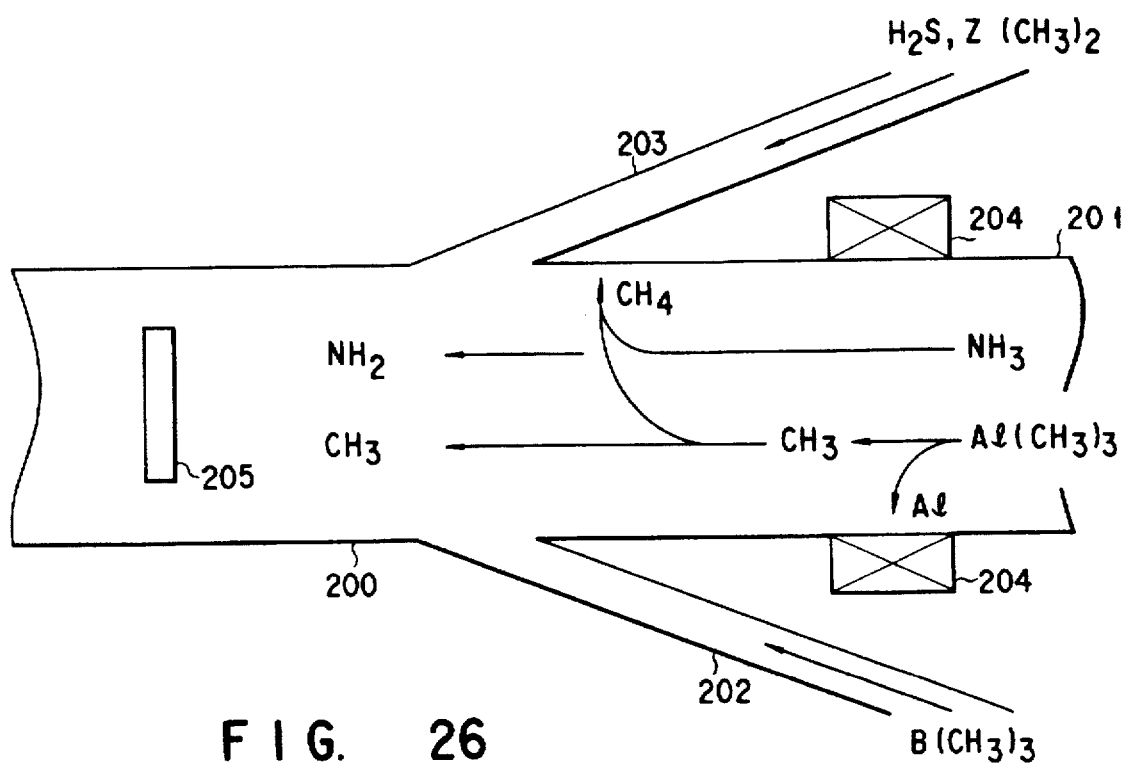
FIG. 26 shows the construction of a CVD apparatus used in Example 11.
Figure 27:
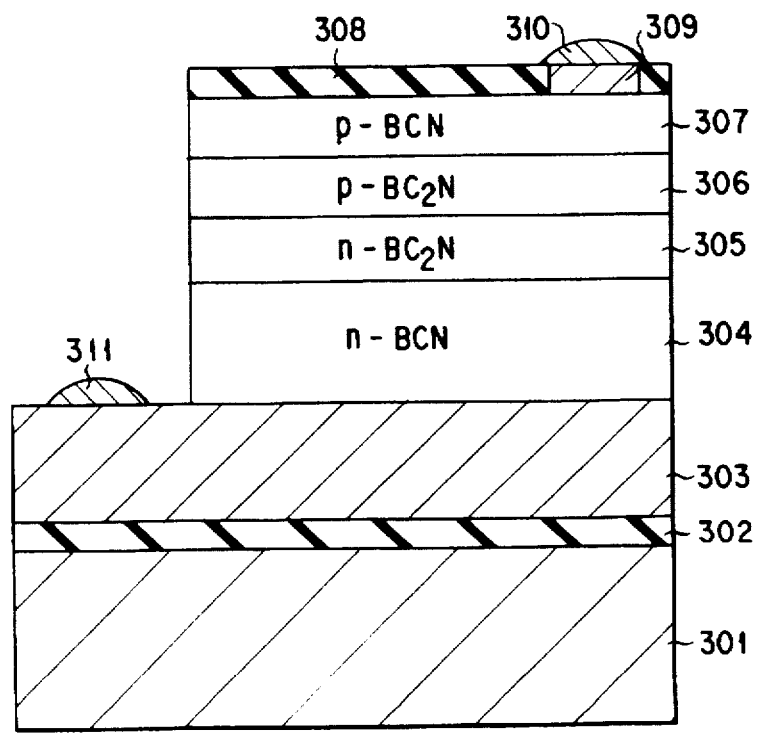
FIG. 27 is a cross sectional view showing the construction of a light-emitting diode prepared in Example 11.

A semiconductor light-emitting diode as shown in FIG. 27 is prepared by using a CVD apparatus 200 as shown in FIG. 26.

As seen from FIG. 26, the CVD apparatus 200, which is made of a stainless steel, comprises a main inlet pipe 201, an auxiliary inlet pipe 202, and an impurity inlet pipe 203. A substrate 205 is arranged within the CVD apparatus 200 so as to be positioned downstream of any of the inlet pipes 201, 202 and 203. The substrate temperature is set at 600 to 800° C. Further, a heater 204 for preliminary heating is arranged to cover the outer surface of the main inlet pipe 201.

Reactant gases of, for examples $Al(CH_3)_3$ (C source) and $NH_3$ (N source) are supplied through the main inlet pipe 201 into the CVD apparatus 200. It should be noted that $Al(CH_3)_3$ is thermally decomposed by the preliminary heating with the heater 204 to generate $CH_3$ radicals and Al metal. The resultant $CH_3$ radicals are supplied onto the substrate 205 so as to achieve carbon deposition on the surface of the substrate 205. On the other hand, the Al metal is trapped by the wall surface of the apparatus. Some of the $CH_3$ radicals perform reaction with $NH_3$ to generate $NH_2$ radicals, with the result that nitrogen is deposited on the substrate surface.

A boron (B) source gas, e.g., $B(CH_3)_3$, is introduced through the auxiliary inlet pipe 202 into the CVD apparatus 200 so as to be decomposed on the substrate surface. As a result, B is deposited on the surface of the substrate 205. Further, a dopant gas such as an n-type dopant gas of $H_2S$ or a p-type dopant gas of $Zn(CH_3)_2$ is introduced through the impurity inlet pipe 203 into the CVD apparatus 200 so as to be decomposed on the surface of the substrate 205. As a result, S or Zn is deposited on the substrate surface.

The CVD apparatus 200 constructed as described above is used for preparing a semiconductor light-emitting diode constructed as shown in FIG. 27. Specifically, a thermal oxide film 302 having a thickness of 0.1 μm is formed first on the surface of a Si substrate 301 sized at 10 cm×10 cm×300 μm, followed by washing the oxide film 302. Then, the substrate 301 is put in the CVD apparatus 200 and heated to 700° C. Under this condition, a reactant gas of $Al(CH_3)_3$ is supplied together with a carrier gas of Ar into the CVD apparatus. When passing through the preliminary heater 204 heated to 900° C., the reactant gas is decomposed into Al metal and $CH_3$ radicals. The Al metal is trapped by the wall of the CVD apparatus. On the other hand, the $CH_3$ radicals are supplied onto the surface of the substrate 301 so as to grow a graphite layer 303 in a thickness of 1 µm on the thermal oxide film 302.

In the next step, reactant gases of Al(CH$_3$)$_3$ and NH$_3$ are supplied through the main inlet pipe 201 into the CVD apparatus 200. At the same time, another reactant gas of B(CH$_3$)$_3$ and an n-type dopant gas of H$_2$S are supplied through the auxiliary inlet pipe 202 and the impurity inlet pipe 203, respectively, into the CVD apparatus 200 so as to grow an n-type BCN layer 304 in a thickness of 1 µm on the graphite layer 303. Then, the flow rate of the Al(CH$_3$)$_3$ gas is increased to twice the previous flow rate, and the flow rate of the H$_2$S gas is decreased to 1/10 the previous flow rate so as to grow an n-type BC$_2$N layer 305 in a thickness of 0.5 µm on the BCN layer 304.

In the next step, a p-type dopant gas of Zn(CH$_3$)$_2$ is supplied in place of the H$_2$S gas through the impurity inlet pipe 203 into the CVD apparatus 200 so as to grow a p-type BC$_2$N layer 306 in a thickness of 0.3 µm on the n-type BC$_2$N layer 305. Then, the flow rate of the Al(CH$_3$)I$_3$ gas is decreased so as to grow a p-type BCN layer 307 in a thickness of 0.3 µm on the p-type BC$_2$N layer 306. Further, the dopant supply is stopped, and an NH$_3$ gas is supplied into the CVD apparatus in a sufficiently large amount compared with the amount of the Al(CH$_3$)$_3$ gas so as to grow a BN layer 308 in a thickness of 0.1 µm on the p-type BCN layer 307. After formation of the BN layer 308, the substrate is taken out of the CVD apparatus.

Further, the BN layer 308 is selectively irradiated with an accelerated hydrogen ion beam for the etching purpose so as to form a contact hole, followed by putting again the substrate in the CVD apparatus. Then, a graphite layer in a thickness of 1 µm is grown on the entire surface of the BN layer 308, followed by taking the substrate out of the CVD apparatus. Then, the surface of the substrate is polished until the surface of the BN layer 308 is exposed to the outside so as to form a graphite electrode 309.

In the next step, the substrate surface is selectively irradiated again with an accelerated hydrogen ion beam so as to etch partly a laminate structure consisting of the BN layer 308, p-type BCN layer 307, p-type BC$_2$N layer 306, n-type BC$_2$N layer 305 and n-type BCN layer 304. As a result, the graphite layer 303 is partly exposed. Under this condition, Au electrodes 310 and 311 are formed on the graphite electrode 309 and the graphite layer 303 by means of a vacuum evaporation, thereby obtaining a desired light-emitting diode.

In the resultant light-emitting diode, the electron concentration of the n-type BCN layer 304 is $1\times10^{18}$ cm$^{-3}$, the electron concentration of the n-type BC$_2$N layer 305 is $2\times10^{17}$ cm$^{-3}$, the hole concentration of the p-type BC$_2$N layer 306 is $5\times10^{16}$ cm$^{-3}$, and the hole concentration of the p-type BCN layer 307 was $1\times10^{18}$ cm$^{-3}$. In this light-emitting diode, light is emitted from the n-type BC$_2$N layer 305 and the p-type BC$_2$N layer 306 forming a pn junction together with the layer 305. It should be noted that the n-type BCN layer 304 and the p-type BCN layer 307 positioned to have these light-emitting layers 305 and 306 sandwiched therebetween have a band gap greater than that of these light-emitting layers, and serve to confine the carriers (electrons and holes) to the light-emitting layers.

A forward bias voltage of 3V is applied across the resultant light-emitting diode, with the result that a current of 10 mA flows through the diode to emit light having a wavelength of 620 nm. The light emission efficiency is found to be 8%.

Incidentally, in the steps of growing the BCN layers and the BC$_2$N layers, it is possible to use a gas of (CNCH$_2$)$_2$AlH as a source of carbon and nitrogen in addition to the source gases used in the example described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device using a semiconductor BCN compound, comprising:
   a light-emitting layer made of a semiconductor BCN compound; and
   a p-type semiconductor BCN compound layer and an n-type semiconductor BCN compound layer positioned to have said light-emitting layer sandwiched therebetween, said p- and n-type semiconductor BCN compounds having a band gap greater than that of the BCN compound forming the light-emitting layer.

2. The semiconductor device according to claim 1, wherein said semiconductor BCN compound constituting the light-emitting layer is made of BC$_2$N.

3. The semiconductor device according to claim 1, wherein said semiconductor BCN compound constituting the layers, positioned to have said light-emitting layer sandwiched therebetween, are made of BCN.

4. A semiconductor device using a semiconductor BCN compound, comprising:
   a light-emitting layer made of a semiconductor BCN compound;
   cladding layers positioned to have said light-emitting layer sandwiched therebetween and made of a p-type semiconductor BCN compound and an n-type semiconductor BCN compound, respectively, said p- and n-type semiconductor BCN compounds having a band gap greater than that of the BCN compound forming the light-emitting layer,
   wherein resonating planes are formed on the edge surfaces of said light-emitting layer and cladding layers.

5. The semiconductor device according to claim 4, wherein said semiconductor BCN compound constituting the light-emitting layer is made of BC$_4$N.

6. The semiconductor device according to claim 4, wherein said semiconductor BCN compound constituting the cladding layers is made of BC$_2$N.

7. The semiconductor device according to claim 4, wherein mirrors made of BN are formed on said resonating planes.

8. A semiconductor device using a semiconductor BCN compound, comprising:
   two semiconductor BCN compound layers forming a pn junction; and
   semiconductor BCN compound layers laminated on one of said layers forming the pn junction,
   wherein band gaps of said semiconductor BCN compounds are sequentially decreased from a surface of the semiconductor device toward an inner region of the semiconductor device.

9. The semiconductor device according to claim 8, wherein an antireflection layer made of BN is formed on the surface thereof.

10. A semiconductor device using a semiconductor BCN compound, comprising:
    a semiconductor BCN compound layer; and a metallic BCN compound layer and/or an insulating BCN compound layer;

wherein said semiconductor BCN compound layer, and said metallic BCN compound layer and/or insulating BCN compound layer are stacked on upon the other;

wherein said semiconductor BCN conductor has a p-type conductivity; and wherein a p-type dopant is selected from the group consisting of S and Si.

11. The semiconductor device according to claim 10, wherein a Schottky junction of the semiconductor BCN compound constituting a light-absorbing layer and the metallic BCN compound is formed.

12. The semiconductor device according to claim 11, wherein the semiconductor BCN compound constituting the light-absorbing layer is made of $BC_2N$, and the metallic BCN compound is selected from the group consisting of C, $BC_3$ and $C_5N$.

13. A semiconductor device using a semiconductor BCN compound, comprising:

a semiconductor BCN compound layer; and a metallic BCN compound layer and/or an insulating BCN compound layer, wherein said semiconductor BCN compound layer, and said metallic BCN compound layer and/or insulating BCN compound layer are stacked on upon the other;

wherein said semiconductor BCN conductor has an n-type conductivity;

wherein an n-type dopant is selected from the group consisting of Zn and Be.

14. The semiconductor device according to claim 13, wherein a Schottky junction of the semiconductor BCN compound constituting a light-absorbing layer and the metallic BCN compound is formed.

15. The semiconductor device according to claim 14, wherein the semiconductor BCN compound constituting a light-absorbing layer is made of $BC_2N$, and the metallic BCN compound is selected from the group consisting of C, $BC_3$ and $C_5N$.

16. A semiconductor device using a semiconductor BCN compound, comprising:

a semiconductor BCN compound layer; and a metallic BCN compound layer and/or an insulating BCN compound layer, wherein said semiconductor BCN compound layer, and said metallic BCN compound layer and/or insulating BCN compound layer are stacked on upon the other; and wherein a heterojunction consisting of semiconductor BCN compound layers differing from each other in composition is formed.

* * * * *